United States Patent
Hsu et al.

(10) Patent No.: US 12,433,011 B2
(45) Date of Patent: Sep. 30, 2025

(54) POST GATE DIELECTRIC PROCESSING FOR SEMICONDUCTOR DEVICE FABRICATION

(71) Applicant: Taiwan Semiconductor Manufacturing Company, Ltd., Hsinchu (TW)

(72) Inventors: Chih-Yu Hsu, Hsinchu County (TW); Jian-Hao Chen, Hsinchu (TW); Chia-Wei Chen, Hsinchu (TW); Shan-Mei Liao, Hsinchu (TW); Hui-Chi Chen, Hsinchu County (TW); Cheng Hong Yang, Hsinchu (TW); Shih-Hao Lin, Hsinchu (TW); Kuo-Feng Yu, Hsinchu County (TW); Feng-Cheng Yang, Hsinchu (TW); Yen-Ming Chen, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 143 days.

(21) Appl. No.: 18/357,864

(22) Filed: Jul. 24, 2023

(65) Prior Publication Data
US 2023/0411220 A1    Dec. 21, 2023

Related U.S. Application Data

(63) Continuation of application No. 17/038,309, filed on Sep. 30, 2020, now Pat. No. 11,735,484.

(51) Int. Cl.
*H10D 84/01* (2025.01)
*H10D 30/01* (2025.01)
(Continued)

(52) U.S. Cl.
CPC ........ *H10D 84/038* (2025.01); *H10D 30/024* (2025.01); *H10D 30/62* (2025.01);
(Continued)

(58) Field of Classification Search
None
See application file for complete search history.

(56) References Cited

U.S. PATENT DOCUMENTS

| 9,876,114 B2 | 1/2018 | Jangjian et al. |
| 2018/0040620 A1 | 2/2018 | Ha |

(Continued)

FOREIGN PATENT DOCUMENTS

| CN | 106972049 A | 7/2017 |
| CN | 110970295 A | 4/2020 |

*Primary Examiner* — Steven B Gauthier
*Assistant Examiner* — Lamont B Koo
(74) *Attorney, Agent, or Firm* — HAYNES AND BOONE, LLP

(57) ABSTRACT

Semiconductor device and the manufacturing method thereof are disclosed. An exemplary semiconductor device comprises a first semiconductor stack and a second semiconductor stack over a substrate, wherein each of the first and second semiconductor stacks includes semiconductor layers stacked up and separated from each other; a dummy spacer between the first and second semiconductor stacks, wherein the dummy spacer contacts a first sidewall of each semiconductor layer of the first and second semiconductor stacks; and a gate structure wrapping a second sidewall, a top surface, and a bottom surface of each semiconductor layer of the first and second semiconductor stacks.

20 Claims, 26 Drawing Sheets

(51) Int. Cl.
*H10D 30/62* (2025.01)
*H10D 84/03* (2025.01)
*H10D 84/85* (2025.01)

(52) U.S. Cl.
CPC ..... *H10D 84/0181* (2025.01); *H10D 84/0193* (2025.01); *H10D 84/853* (2025.01)

(56) References Cited

U.S. PATENT DOCUMENTS

| | | |
|---|---|---|
| 2018/0233369 A1 | 8/2018 | Ando |
| 2019/0165113 A1 | 5/2019 | Lin |
| 2019/0273149 A1 | 9/2019 | Huang |

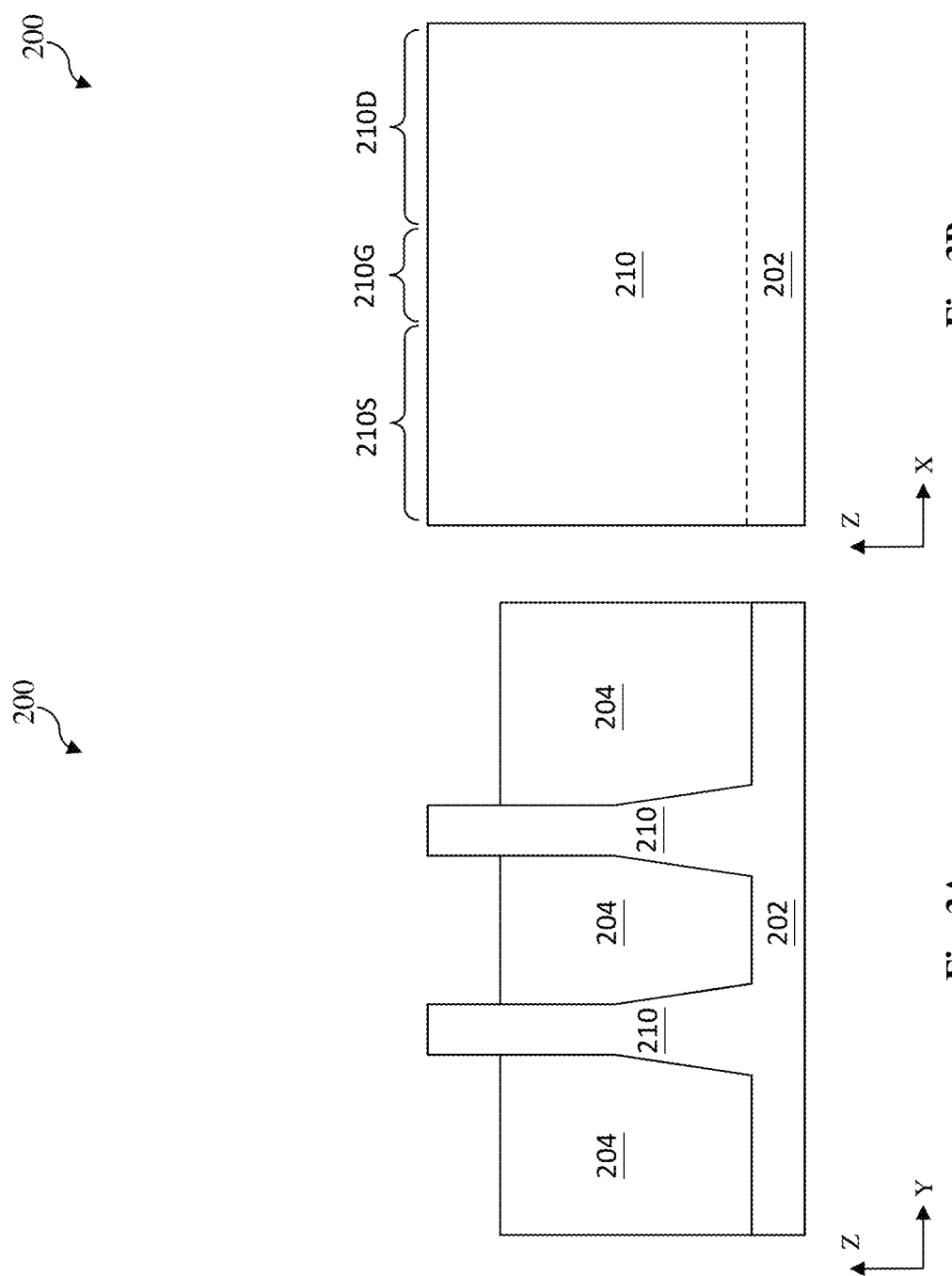

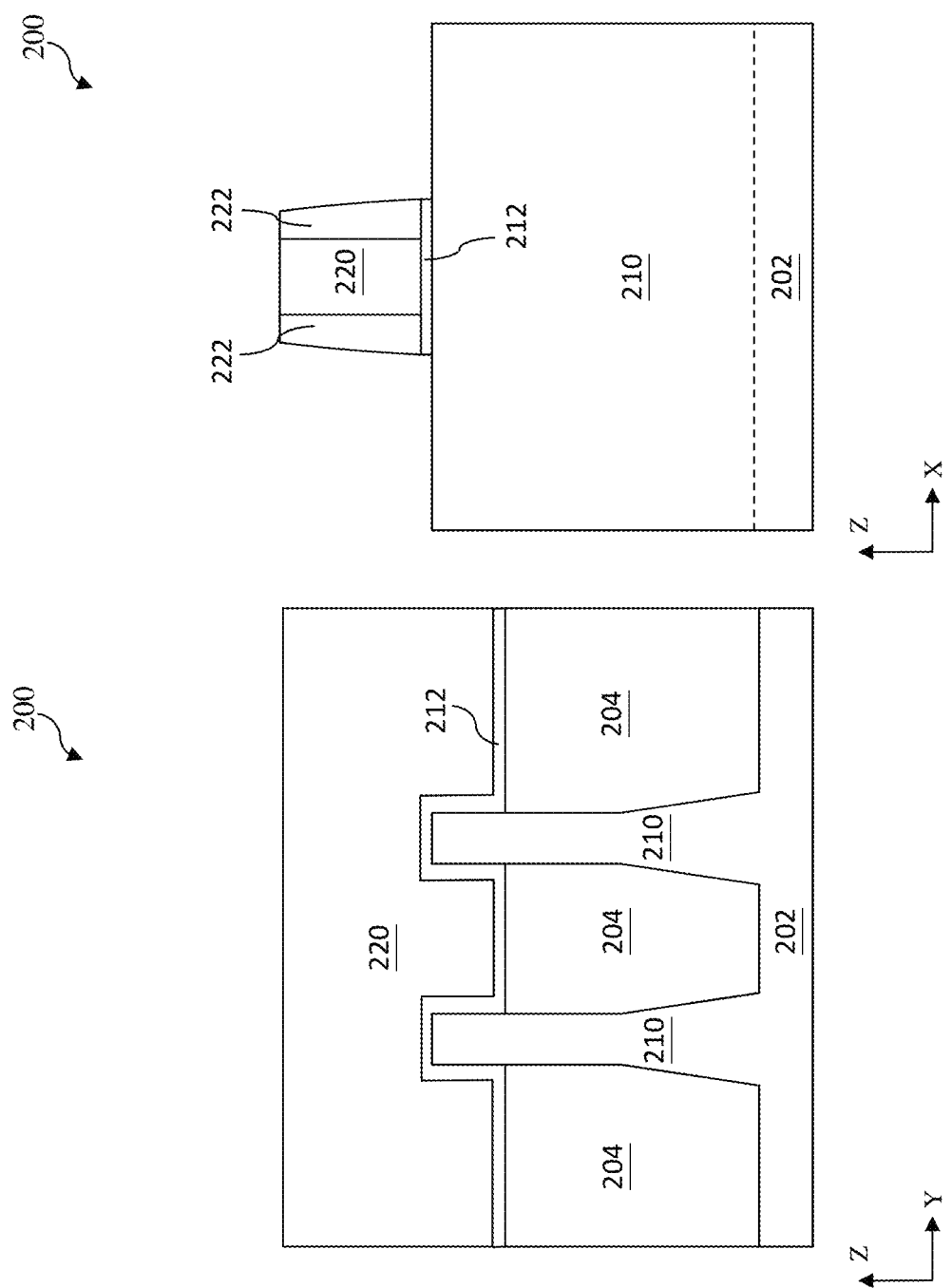

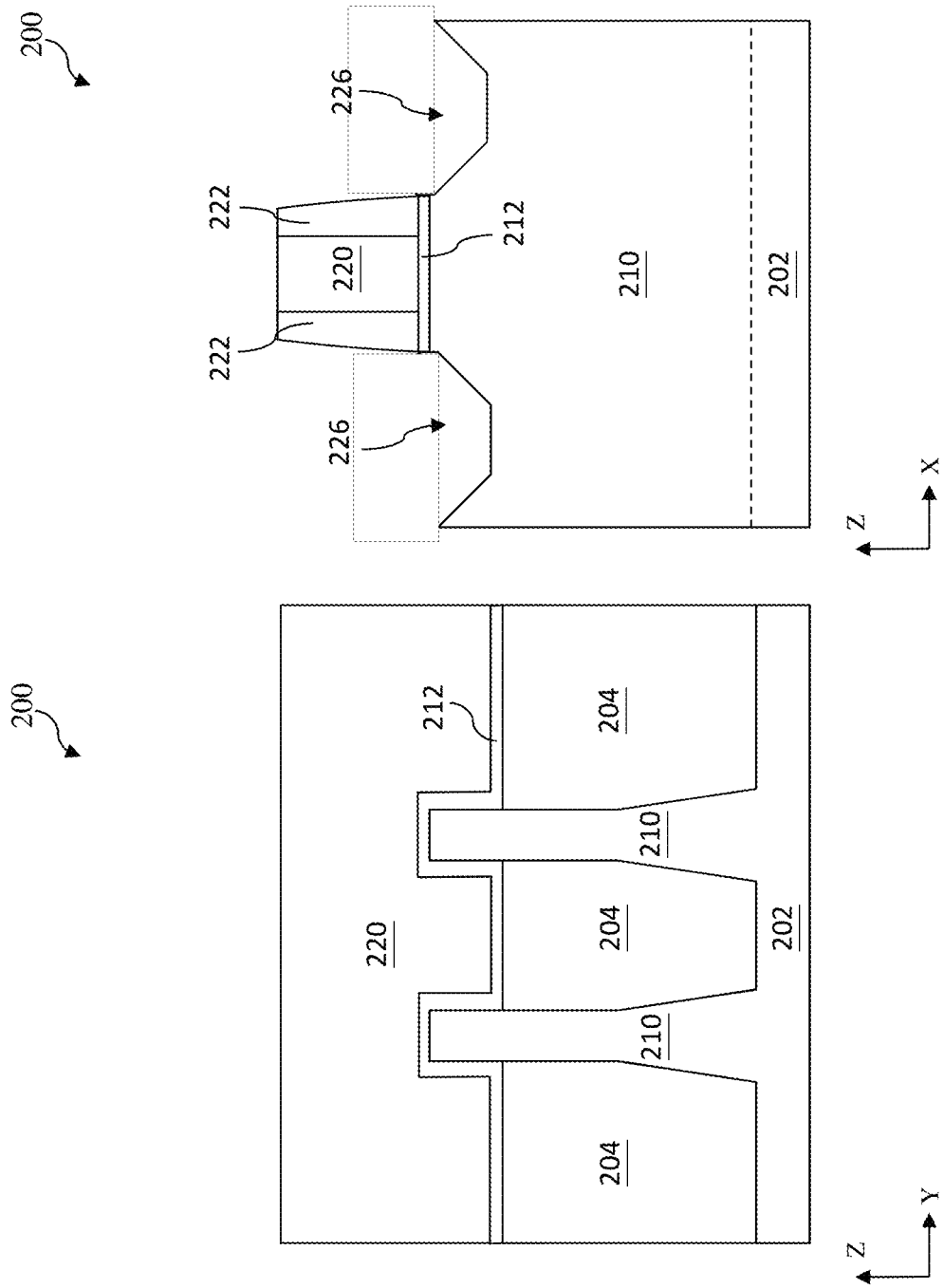

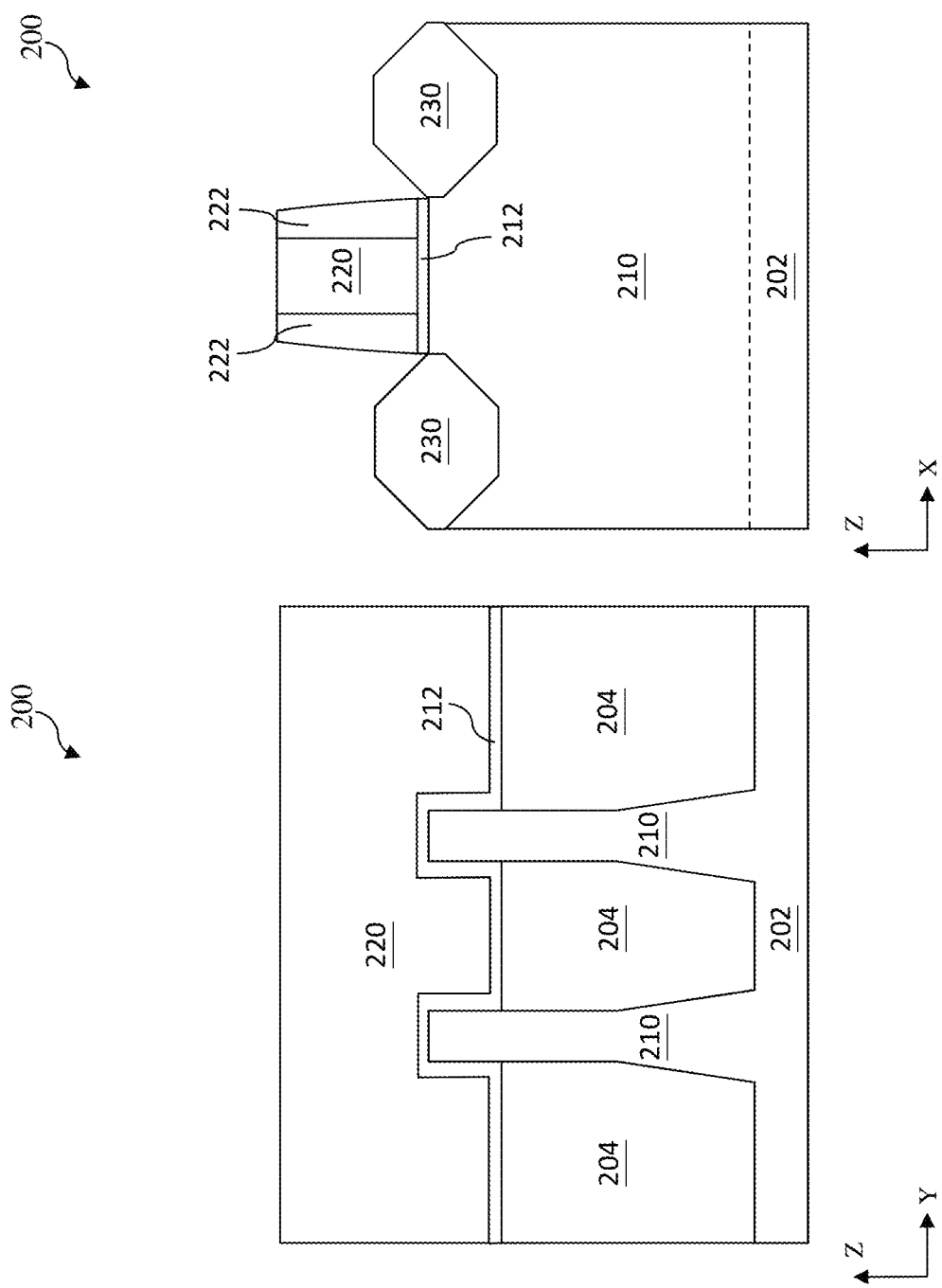

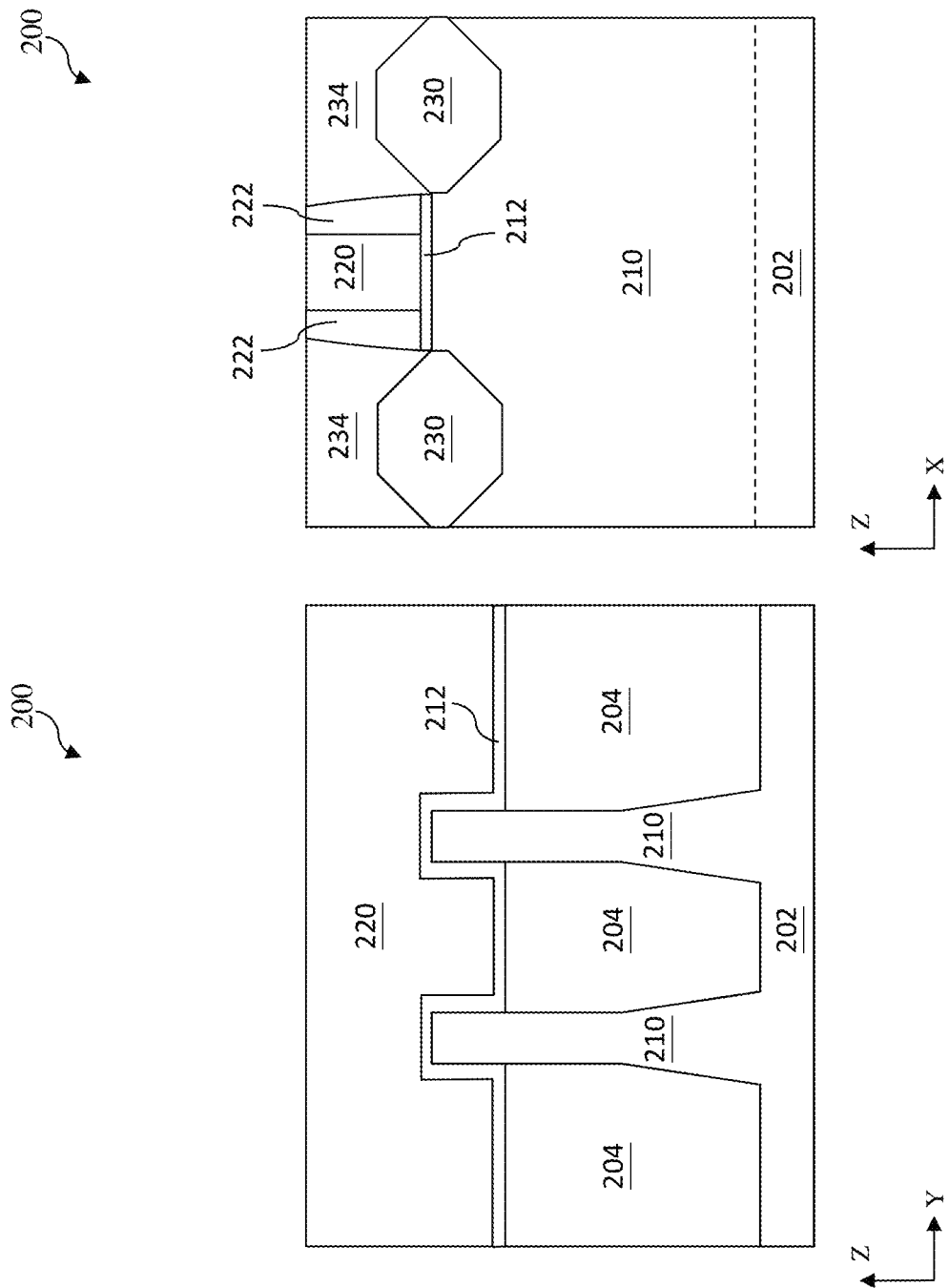

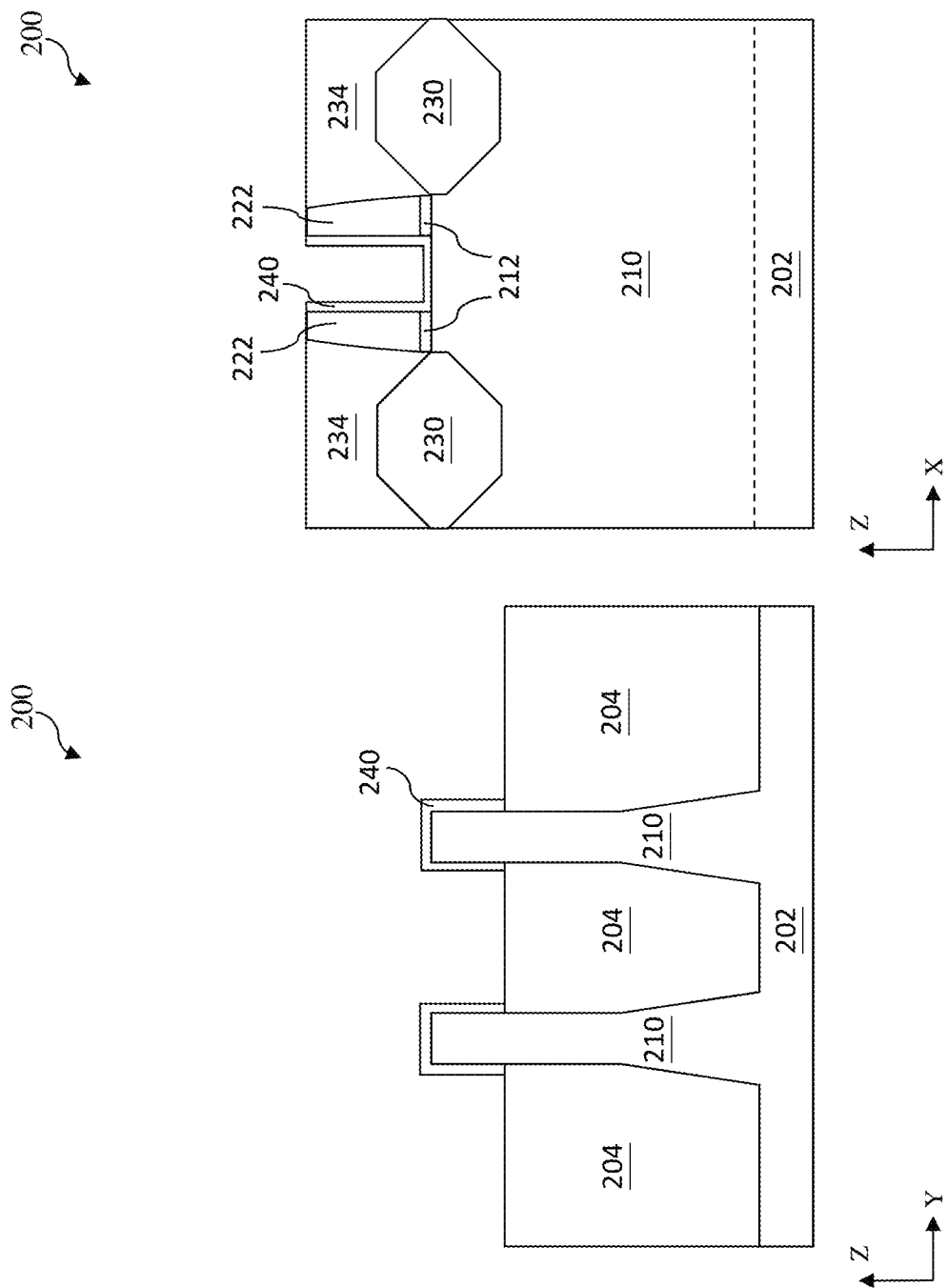

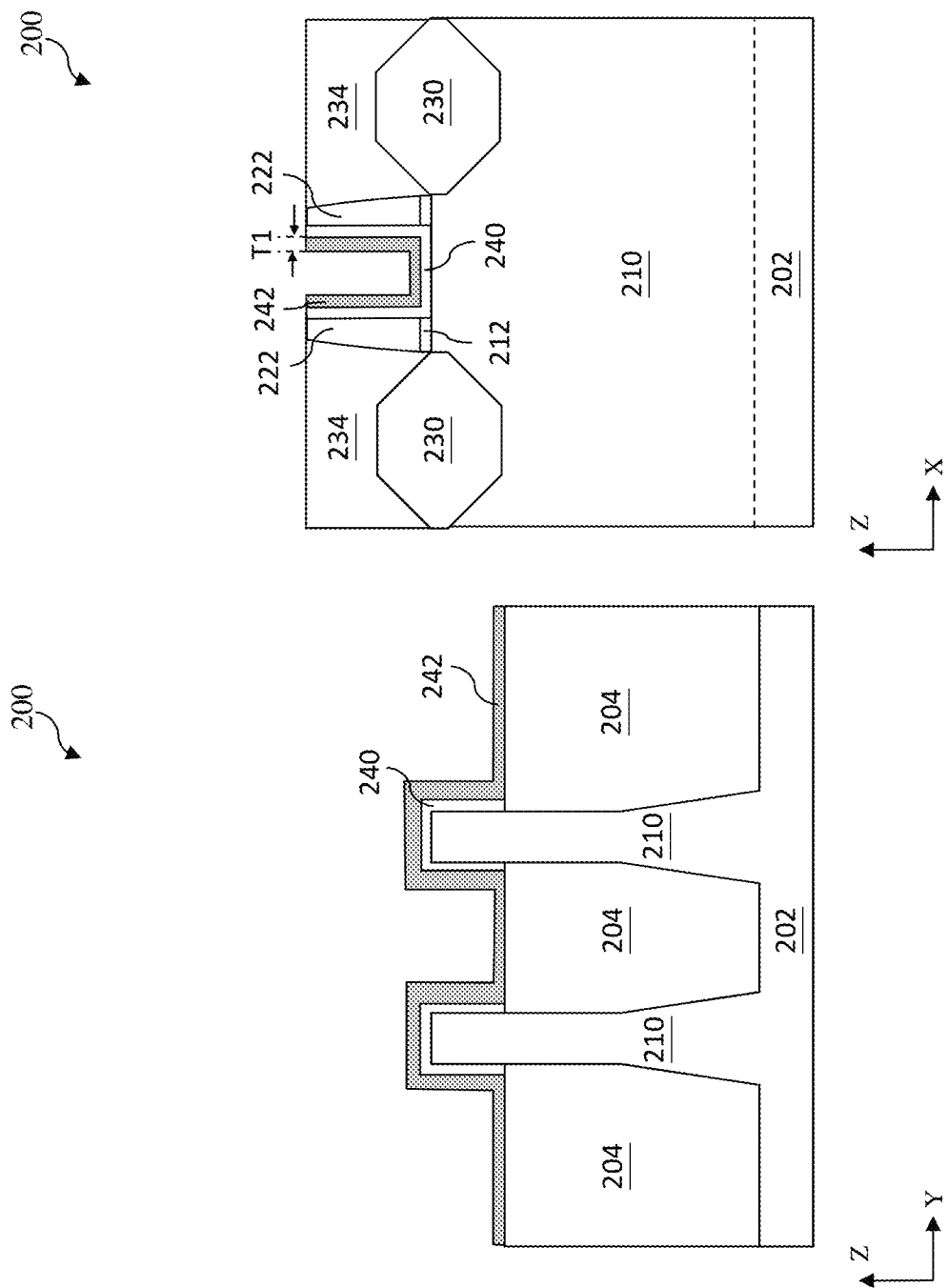

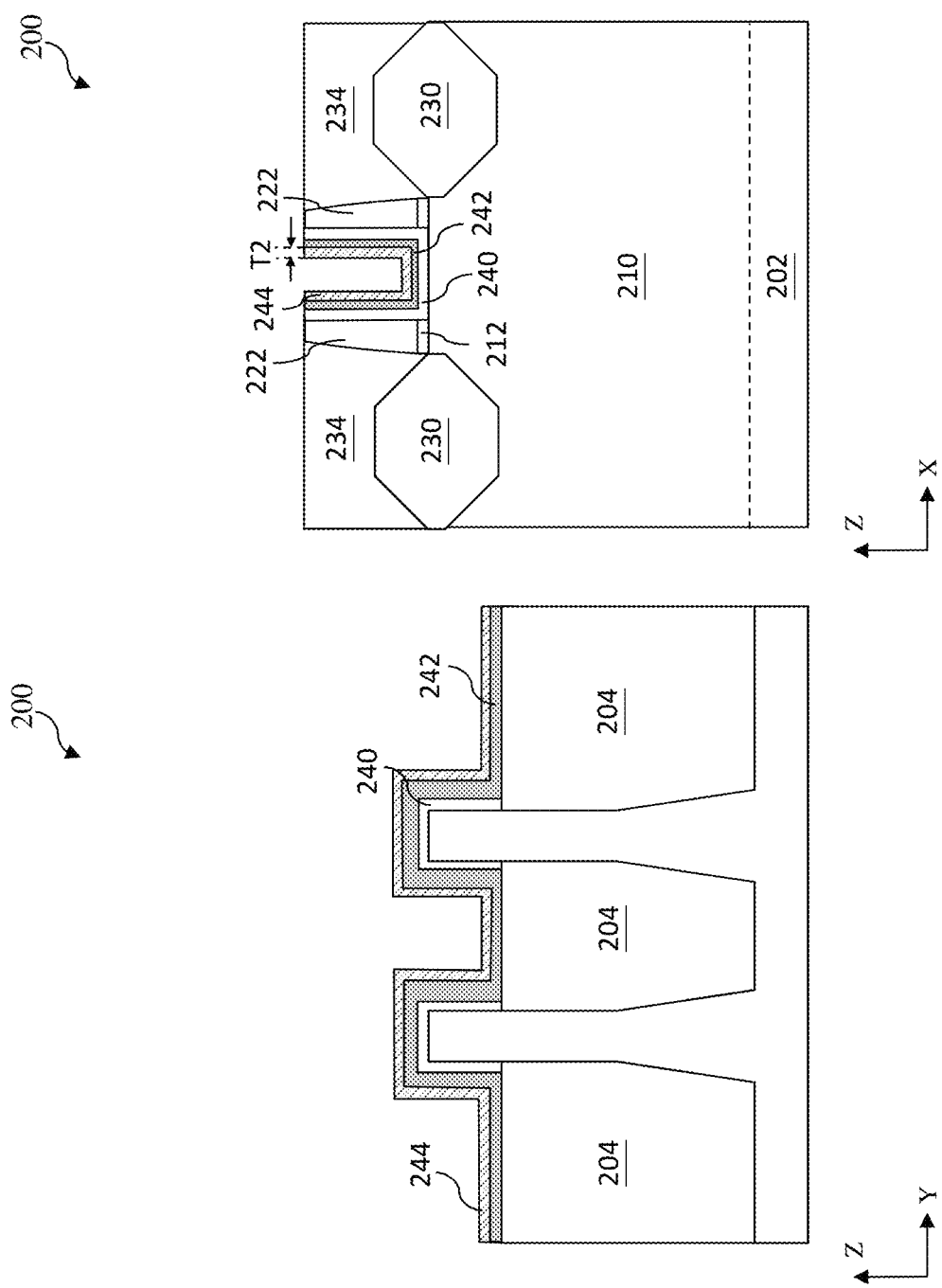

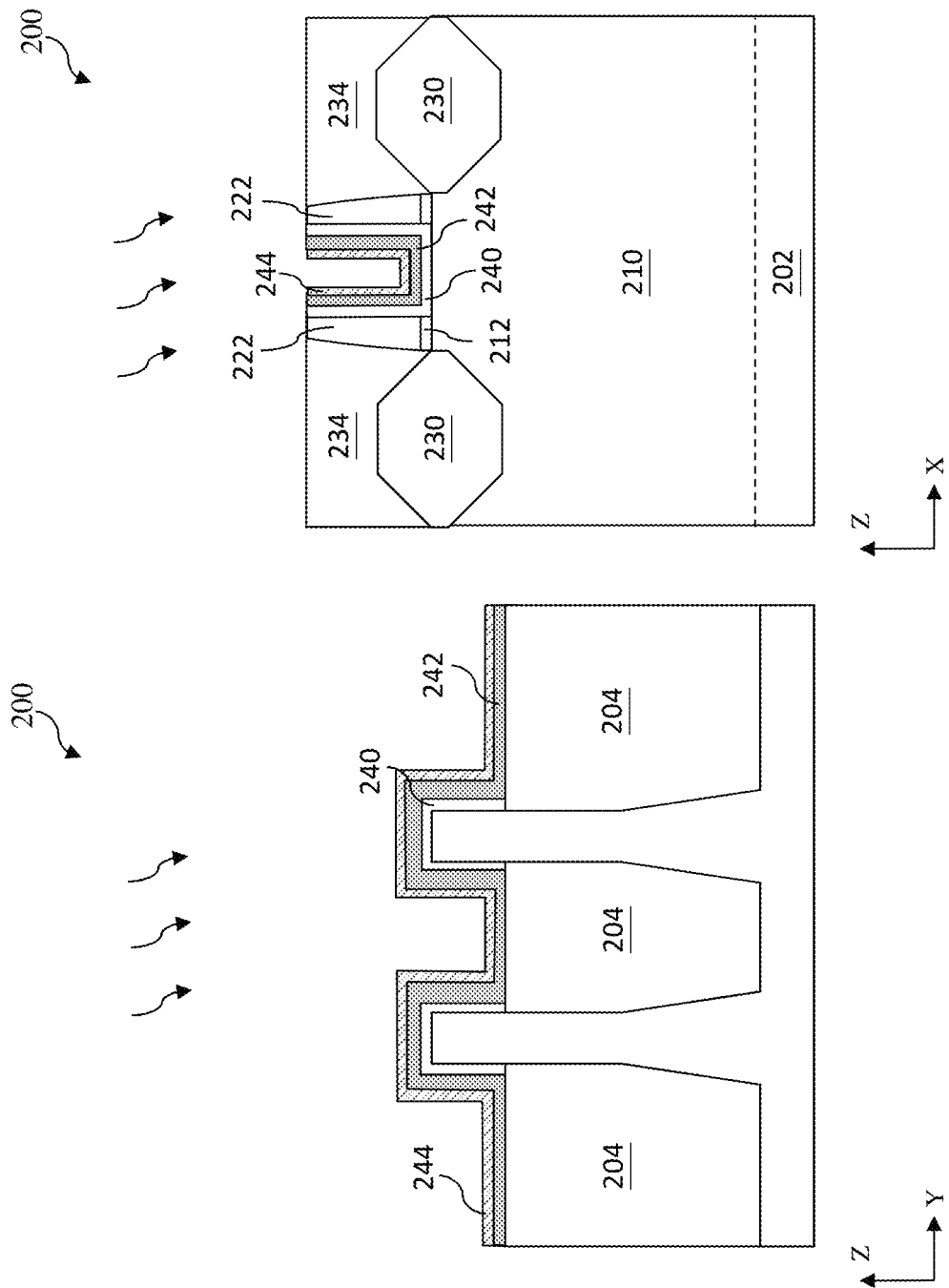

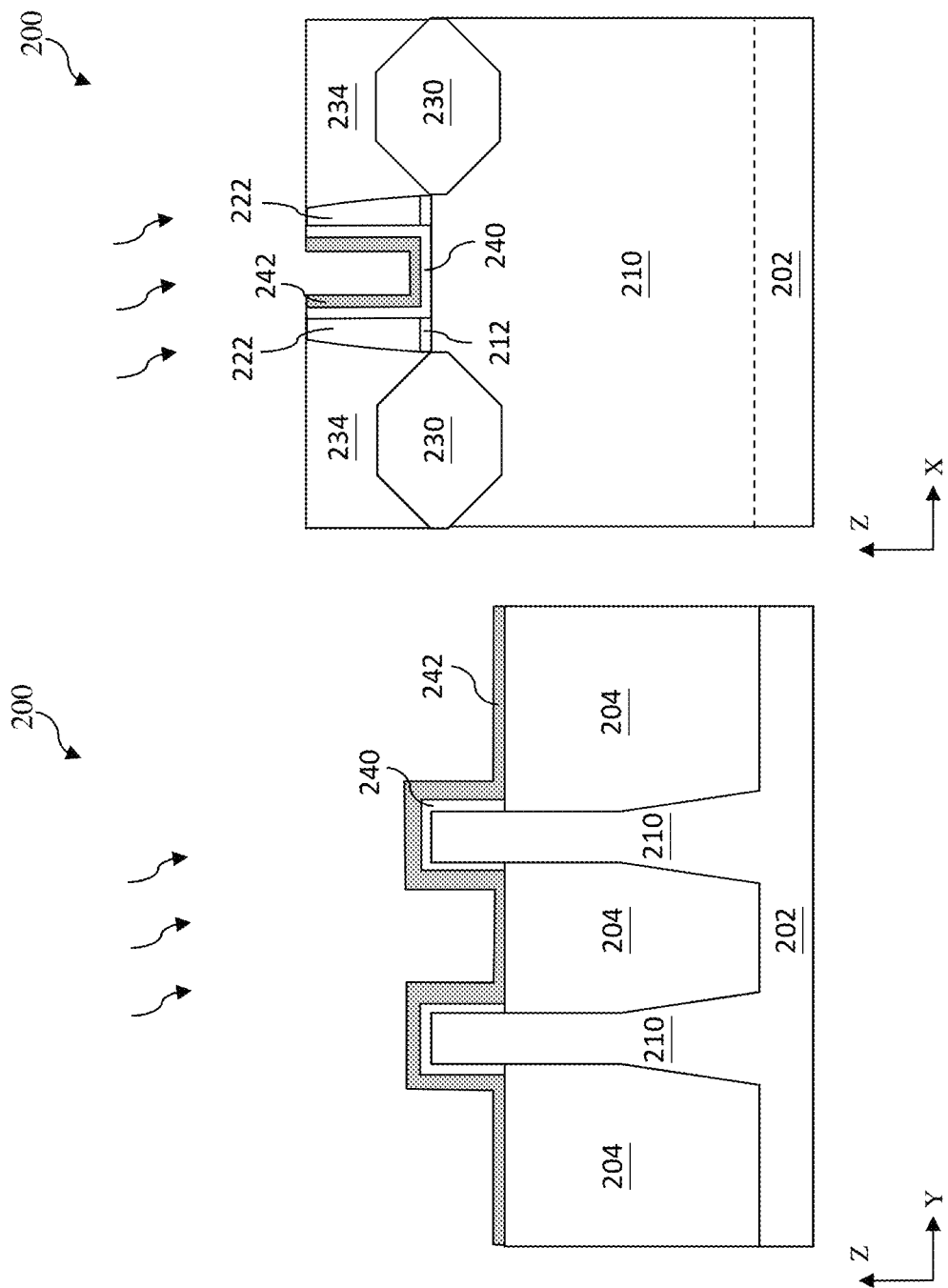

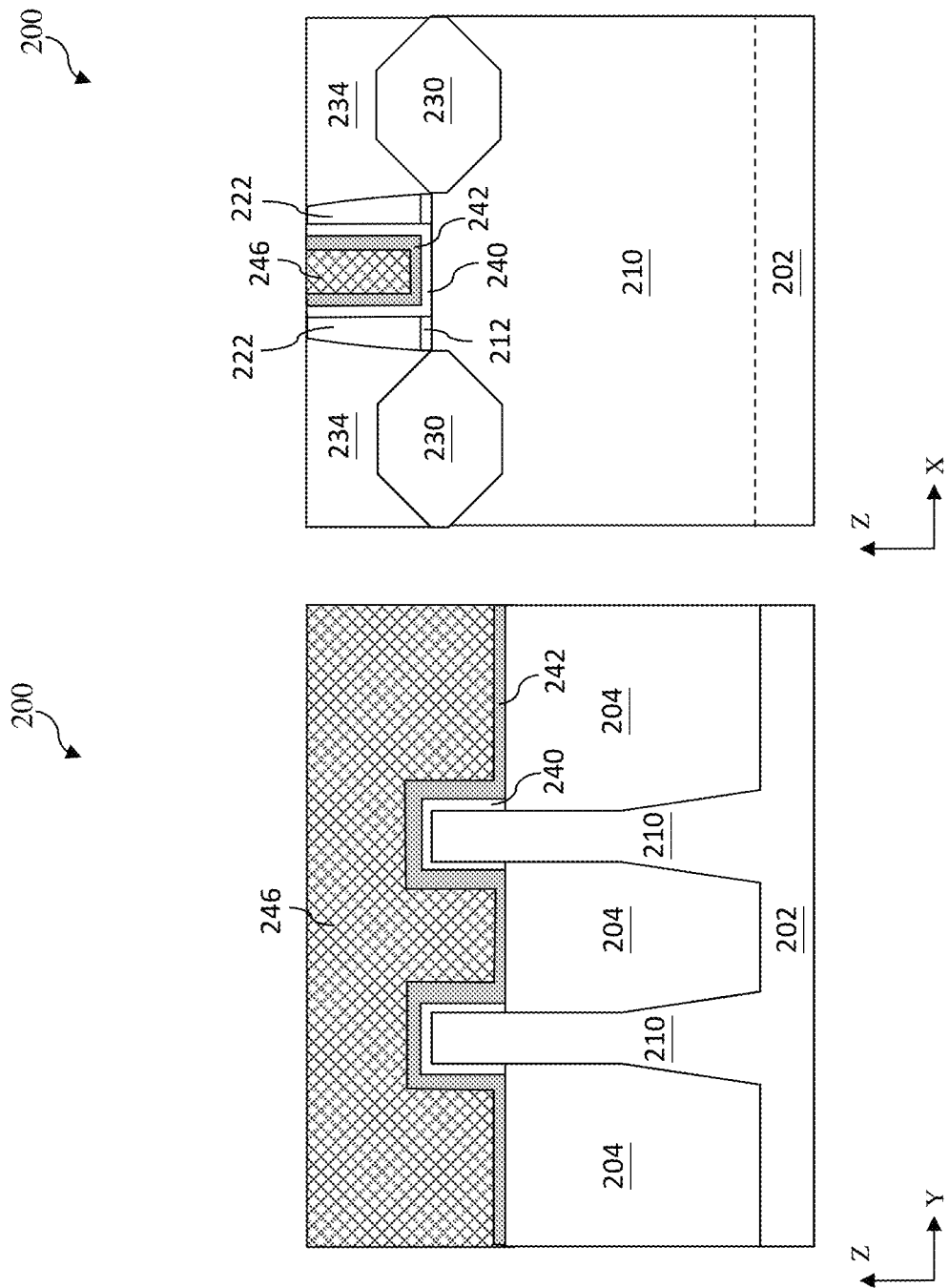

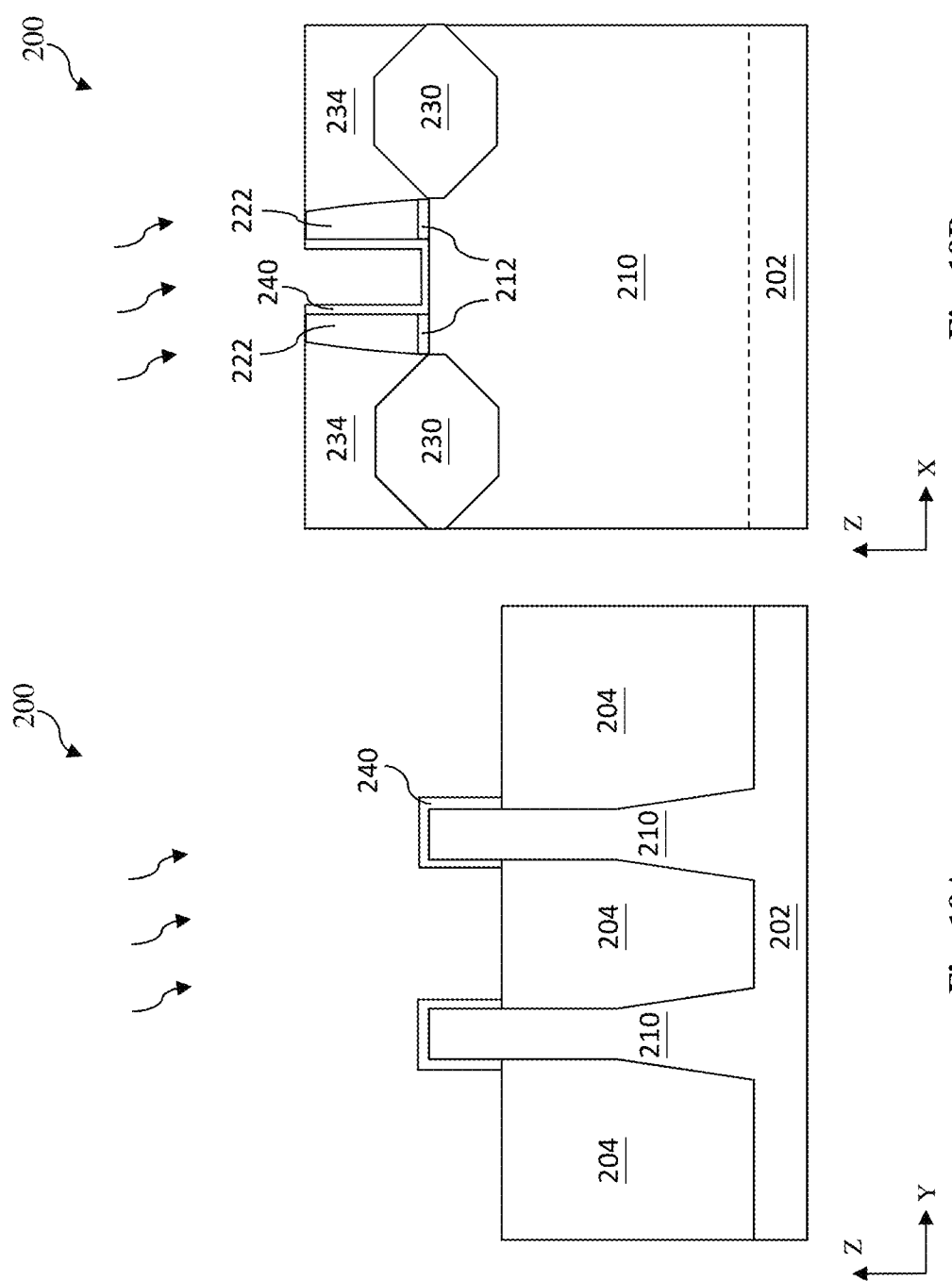

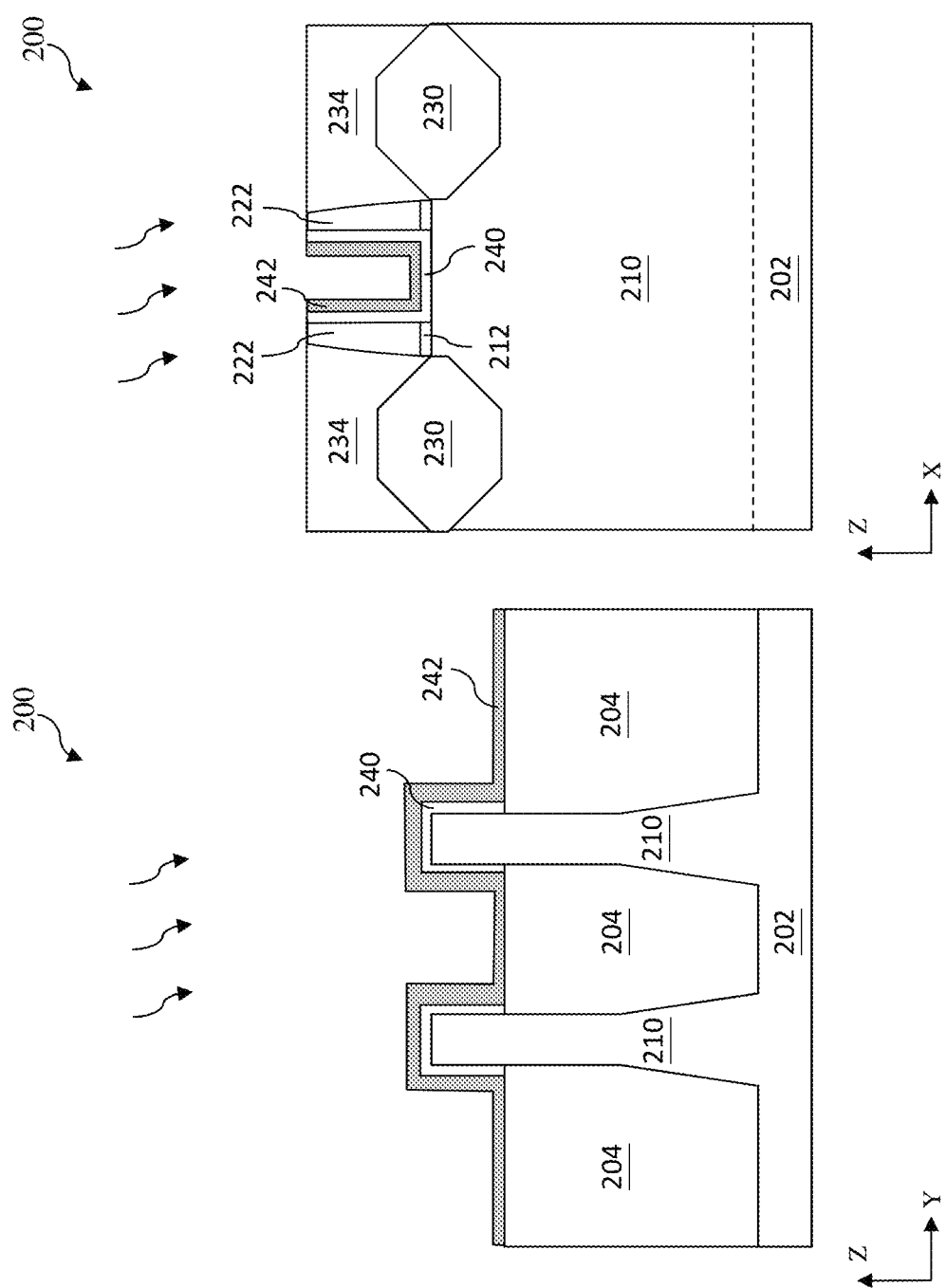

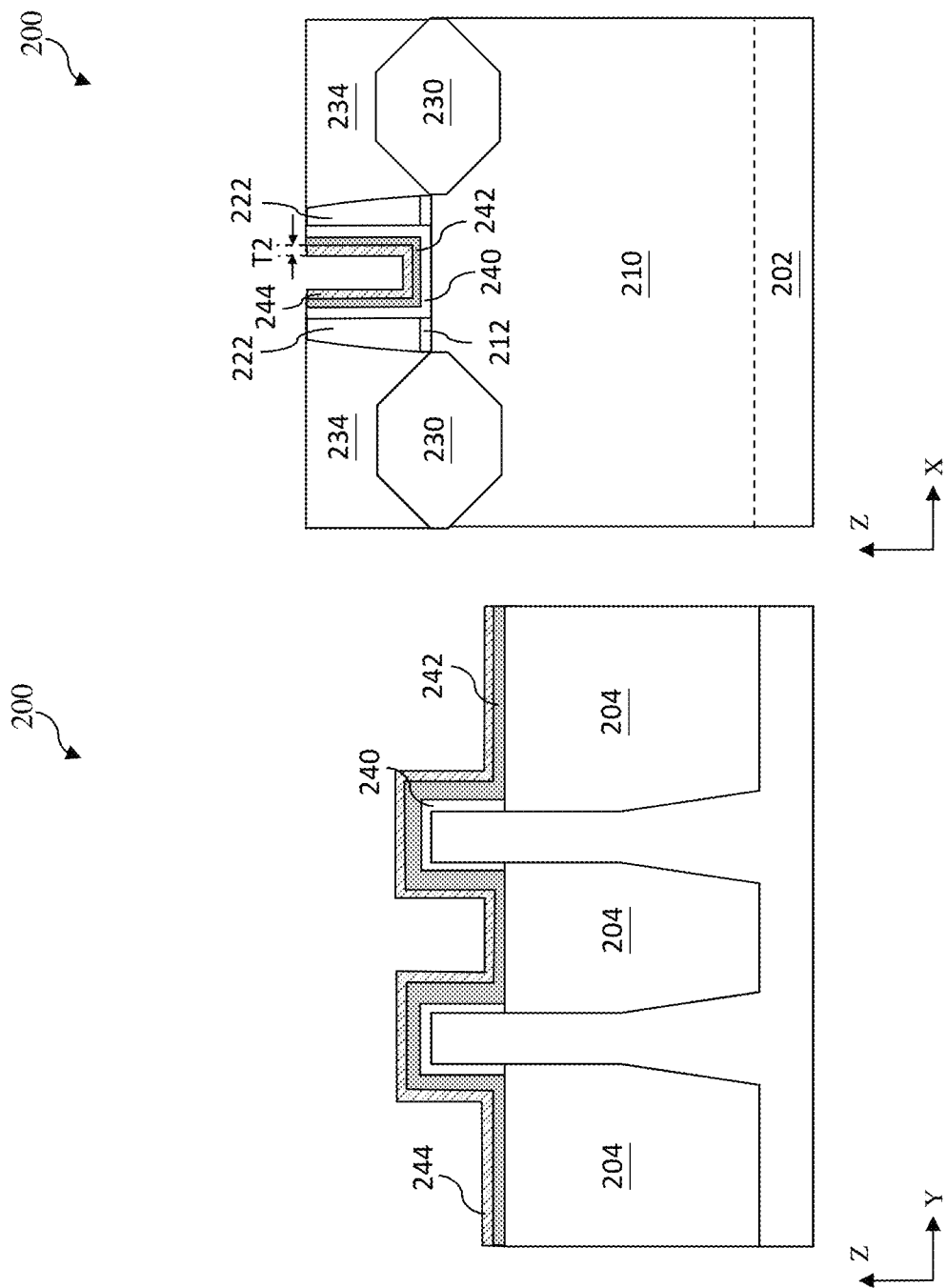

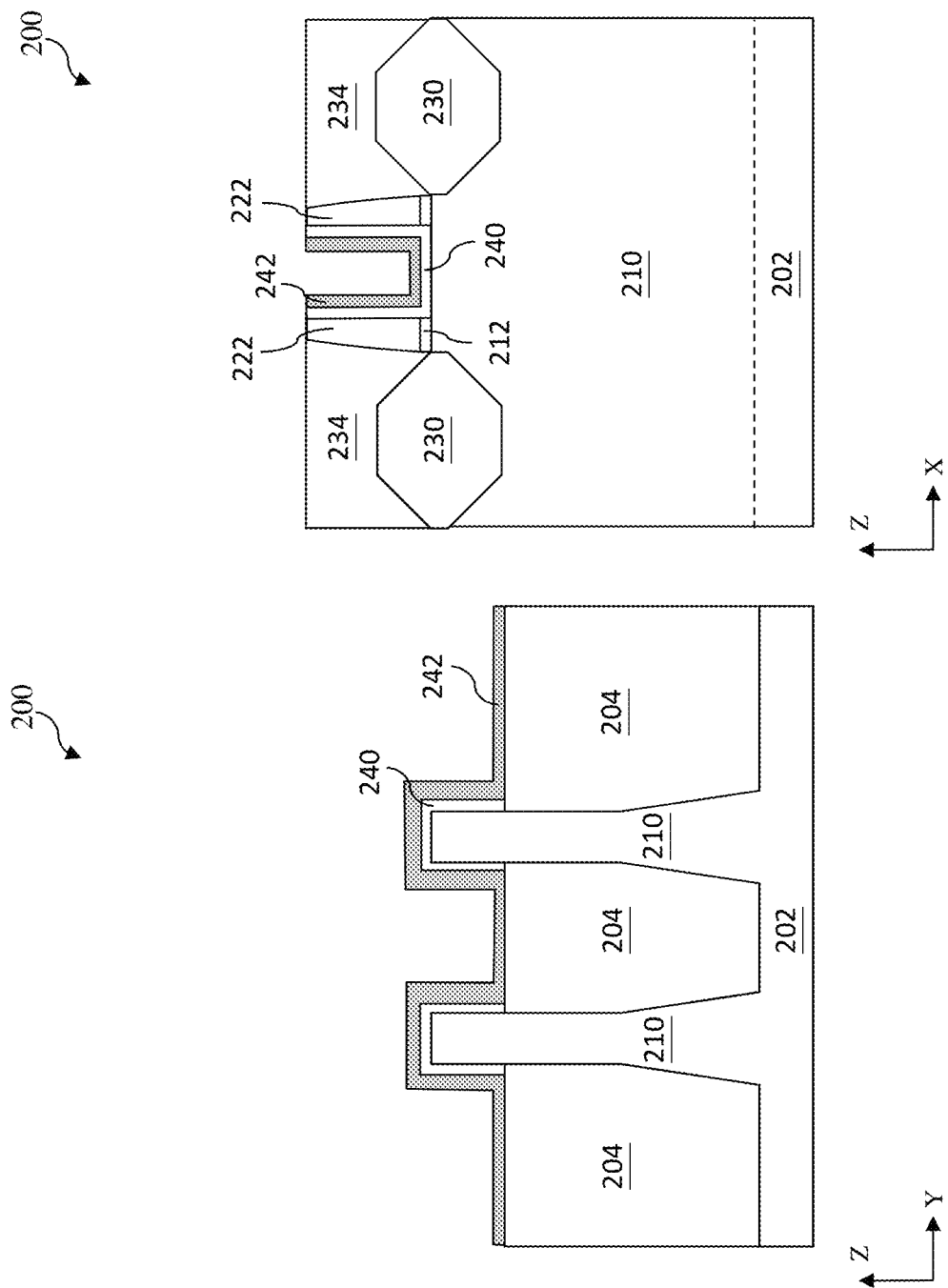

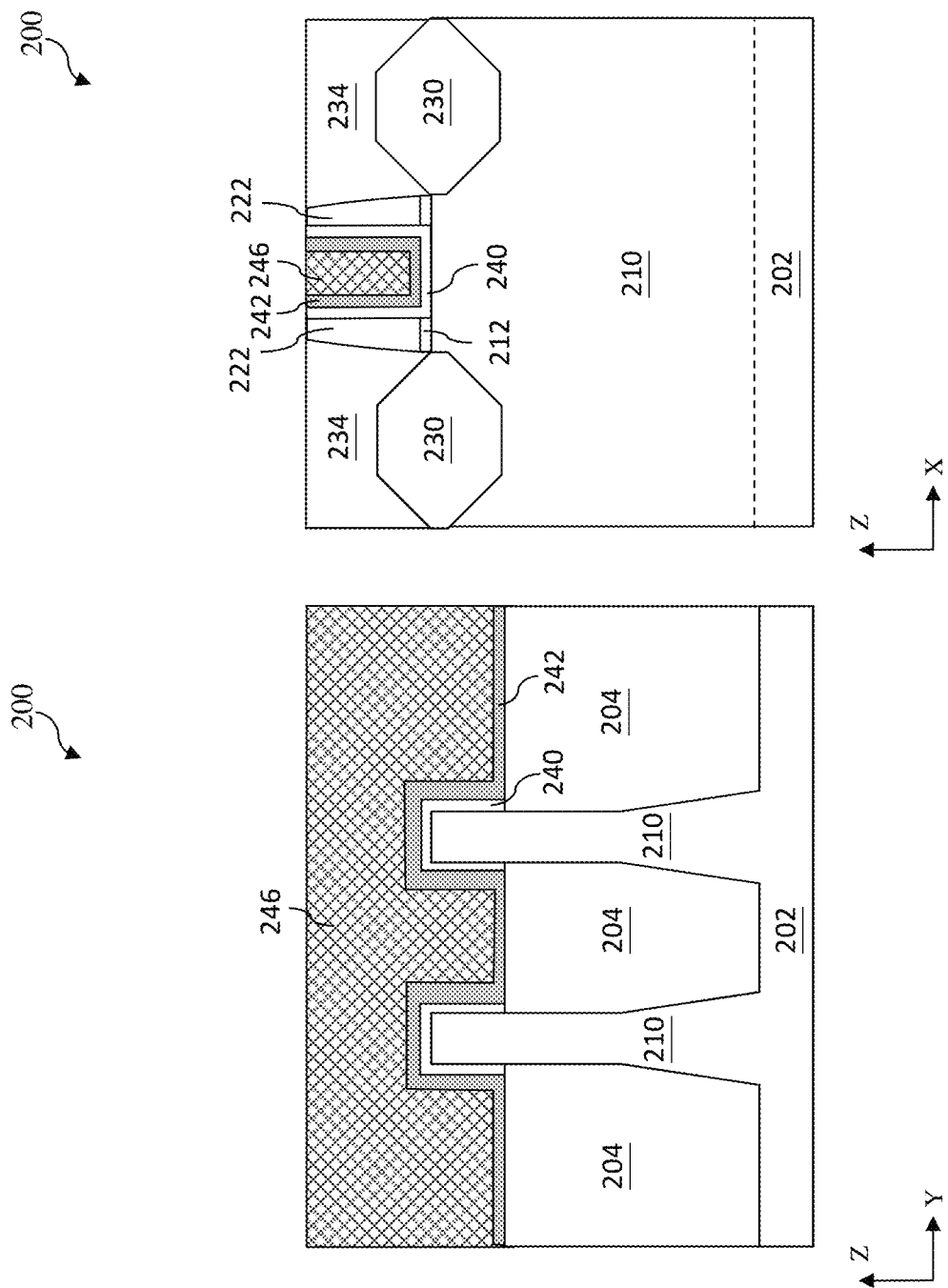

POST GATE DIELECTRIC PROCESSING FOR SEMICONDUCTOR DEVICE FABRICATION

PRIORITY DATA

This application is a continuation of U.S. patent application Ser. No. 17/038,309, filed Sep. 30, 2020, the entirety of which is incorporated herein by reference herein in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three-dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects. For example, it has been observed that the current FinFET devices are suffering with gate leakage issue, which may increase power consumption and reduce IC reliability, such that the performance of the FinFET may be degraded. Accordingly, improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-9A, 11A-17A, and 19A-26A illustrate cross-sectional views of the semiconductor device along line A-A' in FIG. 2 at intermediate stages of the example methods in accordance with some embodiments of the present disclosure.

FIGS. 3B-9B, 11B-17B, and 19B-26B illustrate cross-sectional views of the semiconductor device along line B-B' in FIG. 2 at intermediate stages of the example methods in accordance with some embodiments of the present disclosure.

DETAILED DESCRIPTION

Figure 1:
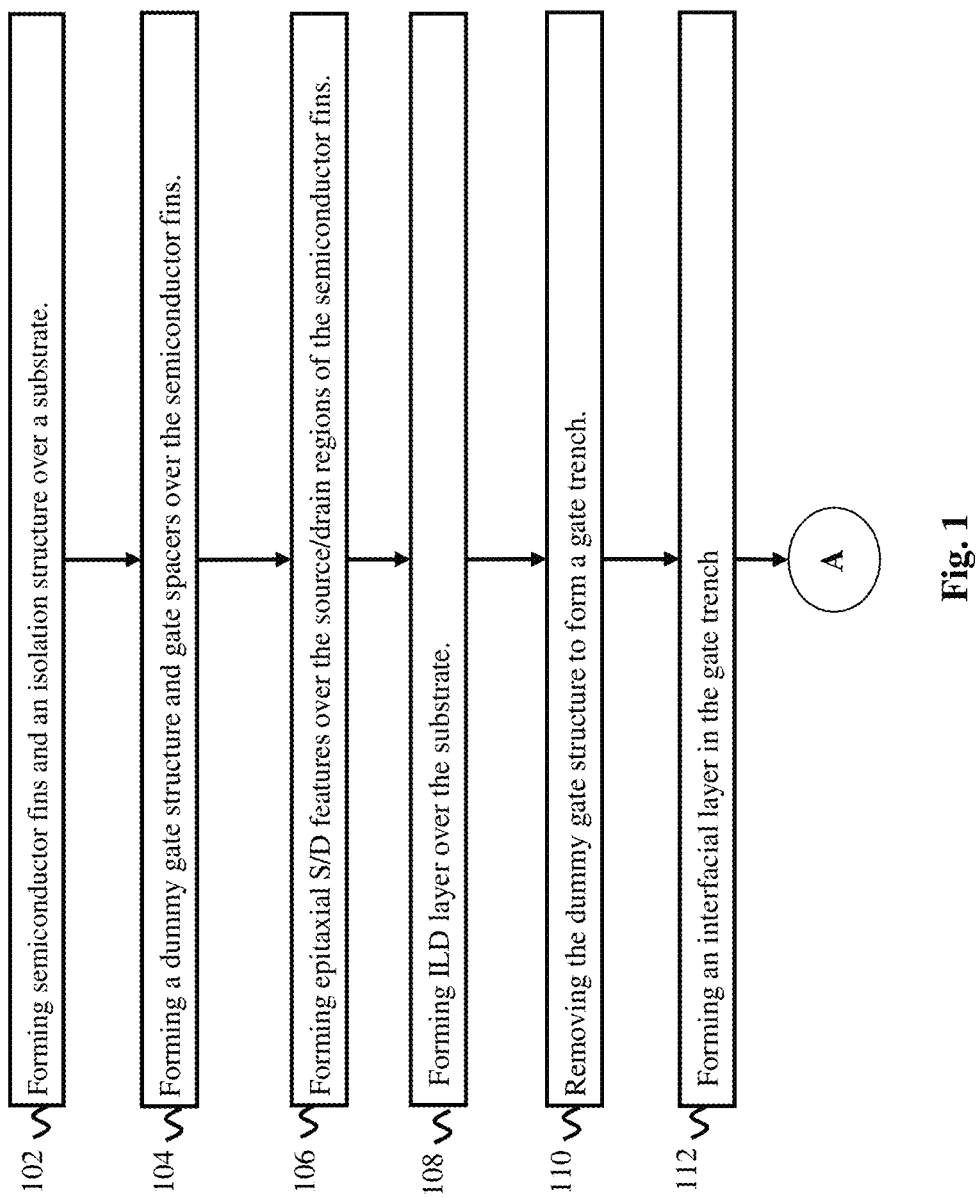
FIGS. 1, 10, and 18 illustrate flowcharts of example methods for making an example semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may comprise embodiments in which the first and second features are formed in direct contact, and may also comprise embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may comprise embodiments in which the features are formed in direct contact, and may also comprise embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating fin-like field-effect transistors (FinFETs) or other three-dimensional semiconductor devices.

One such three-dimensional semiconductor device that has been introduced is the FinFET. The FinFET gets its name from the fin-like structure which extends from a substrate, and which is used to form the field-effect transistor (FET) channel. The fabrication of a three-dimensional semiconductor device includes a gate replacement process to replace a dummy gate structure with a metal gate structure which includes a high-K (HK) dielectric layer and a gate electrode. The HK dielectric material can enhance the gate control ability. The fabrication process also includes forming and removing capping layers over the HK dielectric layer to tune the threshold voltage Vt, the mobility, and the negative bias temperature instability (NBTI) of the device, especially for the P-type FET. However, the formation and removal of the capping layers are of high cost and the removing of the capping layers may damage the HK dielectric layer, which may increase gate leakage, thereby degrade the device performance.

In the present disclosure, a post HK dielectric layer process is introduced to improve the effective oxide thickness (EOT) scaling of the HK dielectric layer, such that the gate leakage issue can be mitigated, the reliability can be improved, and the fabrication cost can be reduced. For example, in the present disclosure, after HK dielectric layer is formed, a capping layer, including HK capping and Silicon (Si) capping materials, is formed within one tool over the HK dielectric layer. The capping layer is annealed and then removed by wet only etching process. Since no dry etching process is involved in the removal of the capping layer, the HK dielectric layer can be protected, the EOT scaling of the HK dielectric layer can be improved. In addition, the formation and removal of the capping layer in the present disclosure can reduce the fabrication cost.

Figure 2:
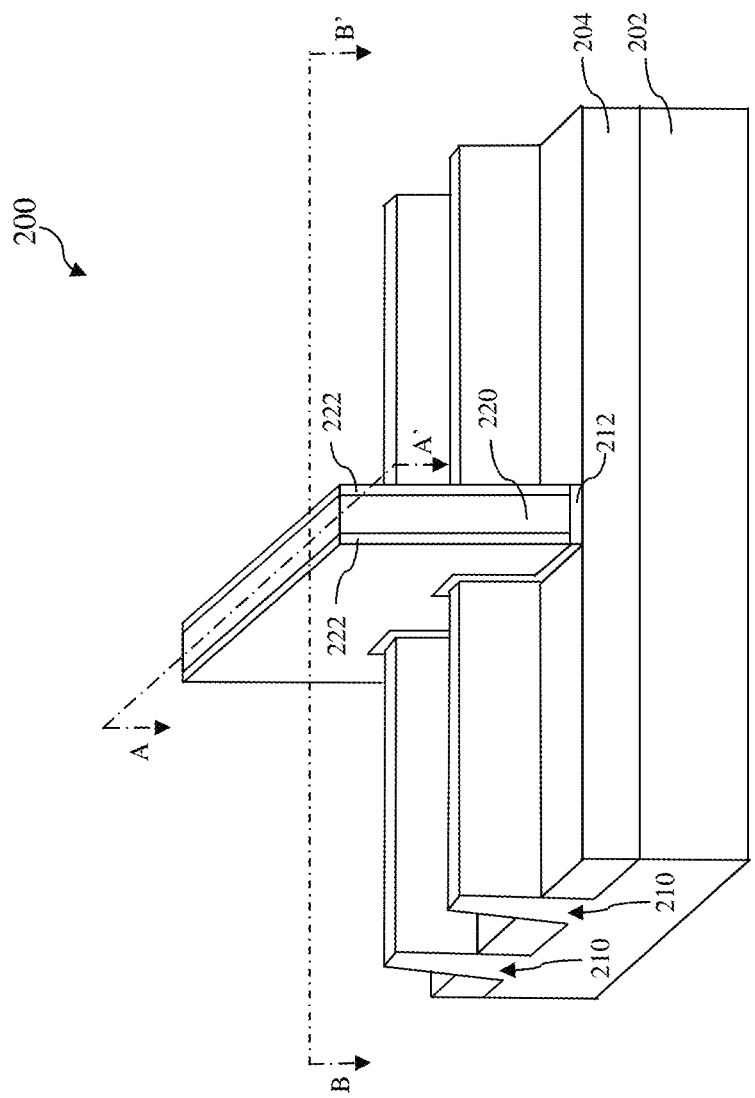
FIG. 2 illustrates a three-dimensional perspective view of the example semiconductor device in accordance with some embodiments of the present disclosure.
Figure 10:
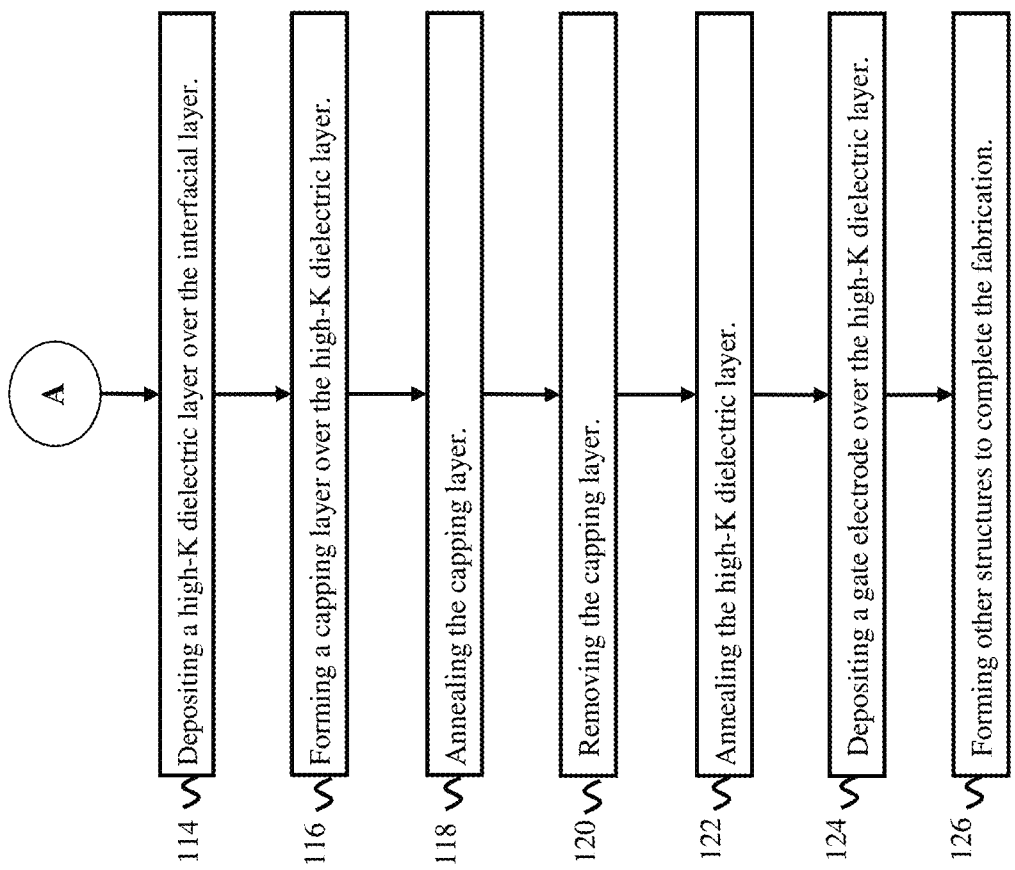
Figures 17A, 17B:
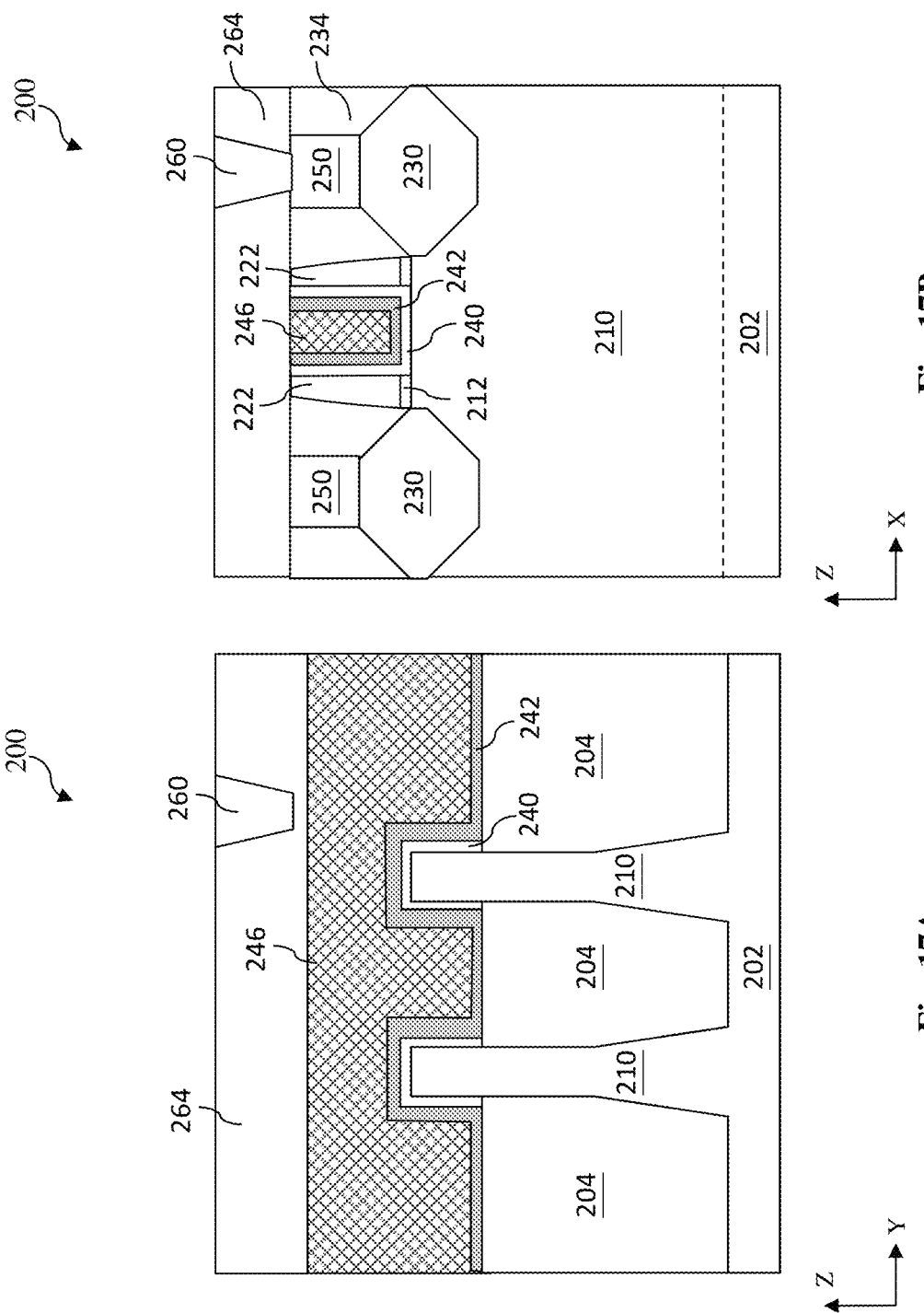
Figure 18:
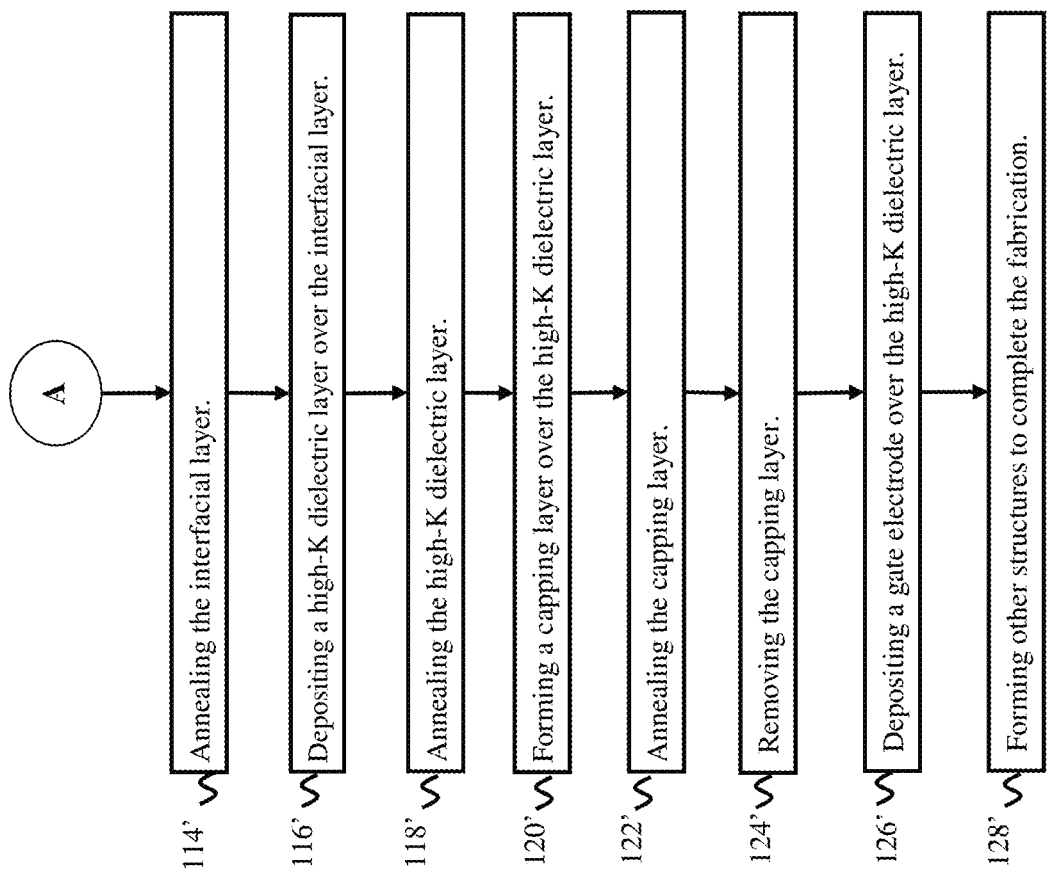

FIG. 1, combined with FIG. 10 or FIG. 18, illustrate flow charts of some methods for making an example semiconductor device in accordance with some embodiments of the present disclosure. The methods are merely examples and are not intended to limit the present disclosure beyond what is explicitly recited in the claims. Additional operations can be performed before, during, and after methods, and some operations described can be replaced, eliminated, or moved around for additional embodiments of the methods. The methods are described below in conjunction with other figures, which illustrate various three-dimensional and cross-sectional views of the device 200 during intermediate steps of the methods. In particular, FIG. 2 illustrates a three-dimensional view of an initial structure of the semiconductor device in accordance with some embodiments of the present disclosure. FIGS. 3A-9A and 11A-17A illustrate cross-sectional views of the semiconductor device along line A-A' (that is, in a Y-Z plane) in FIG. 2 at intermediate stages of the example method of FIGS. 1 and 10 in accordance with some embodiments of the present disclosure. FIGS. 3B-9B and 11B-17B illustrate cross-sectional views of the semiconductor device along line B-B' (that is, in an X-Z plane) in FIG. 2 at intermediate stages of the example method of FIGS. 1 and 10 in accordance with some embodiments of the present disclosure. FIGS. 3A-9A and 19A-26A illustrate cross-sectional views of the semiconductor device along line A-A' (that is, in a Y-Z plane) in FIG. 2 at intermediate stages of the example method of FIGS. 1 and 18 in accordance with some embodiments of the present disclosure. FIGS. 3B-9B and 19B-26B illustrate cross-sectional views of the semiconductor device along line B-B' (that is, in an X-Z plane) in FIG. 2 at intermediate stages of the example method of FIGS. 1 and 18 in accordance with some embodiments of the present disclosure. The figures have been simplified for the sake of clarity to better understand the inventive concepts of the present disclosure.

FIG. 2 illustrates a three-dimensional view of a starting device 200 in accordance with some embodiments of the present disclosure. Device 200 generally refers to any fin-based device, which can be included in a microprocessor, a memory cell, and/or other IC device. In some implementations, device 200 is a portion of an IC chip, a system on chip (SoC), or portion thereof, that includes various passive and active microelectronic devices, such as resistors, capacitors, inductors, diodes, P-type field effect transistors (PFETs), N-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The present disclosure is not limited to any particular number of devices or device regions, or to any particular device configurations. For example, though device 200 as illustrated is a FinFET device, the present disclosure may also provide embodiments for fabricating other three-dimensional semiconductor devices, for example, a nanosheet device (also called as a nanowire device, a nanoring device, a gate-surrounding device, a gate-all-around (GAA) device, or a multi-channel bridge device), whose channel structure includes multiple semiconductor channel layers, and the gate structure extends around the channel layers and provides access to the channel region on all sides. Additional features can be added in device 200, and some of the features described below can be replaced, modified, or eliminated in other embodiments of the device 200.

Referring to FIGS. 1, 2, 3A and 3B, at operation 102, an initial semiconductor structure of device 200 is formed. As depicted in FIGS. 2, 3A and 3B, device 200 comprises a substrate 202. In the depicted embodiment, the substrate 202 is a bulk silicon substrate. Alternatively or additionally, the substrate 202 includes another single crystalline semiconductor, such as germanium; a compound semiconductor; an alloy semiconductor; or combinations thereof. Alternatively, the substrate 202 is a semiconductor-on-insulator substrate, such as a silicon-on-insulator (SOI) substrate, a silicon germanium-on-insulator (SGOI) substrate, or a germanium-on-insulator (GOI) substrate. The substrate 202 may be doped with different dopants to form various doped regions therein. In the depicted embodiment, the substrate 202 includes NFET region 202N comprising P-type doped substrate regions (such as p-well) doped with P-type dopants, such as boron (for example, $^{11}B$, $BF_2$), indium, other P-type dopant, or combinations thereof. The substrate 202 also includes PFET region 202P comprising N-type doped substrate regions (such as n-well) doped with N-type dopants, such as phosphorus (for example, $^{31}P$), arsenic, other N-type dopant, or combinations thereof. In some embodiments, the substrate 202 includes doped regions formed with a combination of P-type dopants and N-type dopants. An ion implantation process, a diffusion process, and/or other suitable doping process can be performed to form the various doped regions.

Device 200 also includes an isolation structure 204 disposed over the substrate 202. Isolation structure 204 electrically isolates active device regions and/or passive device regions of the device 200. The isolation structure 204 can be configured as different structures, such as a shallow trench isolation (STI) structure, a deep trench isolation (DTI) structure, a local oxidation of silicon (LOCOS) structure, or combinations thereof. The isolation structure 204 includes an isolation material, such as silicon oxide (SiO), silicon nitride (SiN), silicon oxynitride (SiON), other suitable isolation material (for example, including silicon, oxygen, nitrogen, carbon, and/or other suitable isolation constituent), or combinations thereof.

Device 200 further includes semiconductor fins 210 protruding from the substrate 202 and the lower portions of semiconductor fins 210 are separated by the isolation structure 204. Each semiconductor fin 210 may be suitable for providing an N-type FET or a P-type FET. In the present disclosure, the semiconductor fins 210 are for P-type FET. Fins 210 are oriented substantially parallel to one another. Each of fins 210 has at least one channel region 210G and at least one source region 210S and at least one drain region 210D defined along their length in the X-direction. In some embodiments, fins 210 are a portion of substrate 202 (such as a portion of a material layer of substrate 202). For example, in the depicted embodiment, where substrate 202 includes silicon, fins 210 include silicon. Alternatively, in some embodiments, fins 210 are defined in a material layer, such as one or more semiconductor material layers, overlying the substrate 202. For example, fins 210 can include a semiconductor layer stack having various semiconductor layers (such as a heterostructure) disposed over the substrate 202. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of the device 200. The fins 210 are formed by any suitable process including various deposition, photolithography, and/or etching processes. In some embodiments, fins 210 can be formed by a double-patterning lithography (DPL) process. It is understood that multiple parallel fins 210 may be formed in a similar manner.

Referring to FIGS. 1, 2, 4A and 4B, at operation 104, a dummy gate structure 220 is formed over the fins 210. The dummy gate structure 220 serves as a placeholder for subsequently forming a metal gate structure. In some embodiments, the dummy gate structure 220 extends along the Y-direction and traverse respective fins 210. The dummy gate structure 220 covers the channel regions of the fins 210 which interpose the source regions and the drain regions (both referred to as the S/D regions). The dummy gate structure 220 may include various dummy gate layers, for example, a dummy gate electrode (for example, including polysilicon) over the channel regions of the fins 210 and one or more hard mask layers over the dummy gate electrode, and/or other suitable layers. A dummy dielectric layer 212 formed of silicon oxide may be deposited (for example, by chemical vapor deposition (CVD), physical vapor deposition (PVD), atomic layer deposition (ALD), and/or other suitable deposition process) over the fins 210 and the isolation structure 204 before forming the dummy gate structure 220. Thereafter, the dummy gate layer materials are deposited over the dummy dielectric layer 212. A lithography process is then performed to form a mask covering the channel regions of the fins 210. Thereafter, the different dummy gate layers are etched using the lithography mask to form the dummy gate structures 220. The lithography mask is then removed using any proper method.

Still at operation 104, gate spacers 222 are formed along sidewalls of the dummy gate structures 220. The gate spacers 222 may include various layers, for example, one or more dielectric layers and pattern layers. In some embodiments, the gate spacer 222 may include any suitable dielectric material, such as silicon, oxygen, carbon, nitrogen, other suitable material, or combinations thereof (for example, SiO, SiN, SiON, or silicon carbide (SiC)). The gate spacers 222 may be formed by various suitable methods, such as various deposition processes (for example, ALD, CVD, PVD, other suitable methods, or combinations thereof), various photolithography processes, and/or various etching processes (for example, dry etching, wet etching, or a combination thereof).

Referring to FIGS. 1, 5A, 5B, 6A, and 6B, at operation 106, epitaxial S/D features 230 are formed over the S/D regions of the fins 210. Referring to FIGS. 5A and 5B, first, the S/D regions of the fins 210 are recessed along the sidewalls of the gate spacers 222 to form the S/D trenches 226. A S/D etching process is performed to remove the portions of the fins 210 over the S/D regions. The S/D etching process may be a dry etching (such as reactive ion etching (RIE)), a wet etching, or a combination thereof.

Thereafter, referring to FIGS. 6A and 6B, the S/D features 230 are epitaxially grown in the S/D trenches 226. The epitaxial S/D features may comprise different semiconductor materials for different type (N-type or P-type) S/D features. For example, the N-type epitaxial S/D feature may include materials such as silicon and/or carbon, where the silicon-containing epitaxial layers or silicon-carbon-containing epitaxial layers are doped with phosphorous, arsenic, other N-type dopant, or combinations thereof (for example, forming an Si:P epitaxial layer, an Si:C epitaxial layer, or an Si:C:P epitaxial layer). The P-type epitaxial S/D feature may include materials such as silicon and/or germanium, where the silicon-germanium-containing epitaxial layers are doped with boron, carbon, other P-type dopant, or combinations thereof (for example, forming an Si:Ge:B epitaxial layer or an Si:Ge:C epitaxial layer). In some embodiments, the S/D features 230 include more than one crystalline layers formed one over another. In some embodiments, the epitaxial S/D features 230 include materials and/or dopants that achieve desired tensile stress and/or compressive stress in the channel regions. In various embodiments, different epitaxial layer(s) of the epitaxial S/D features 230 may include same or different semiconductor materials. An epitaxy process is implemented to grow the S/D features 230 in the S/D trenches 226. The epitaxy process includes CVD deposition (for example, vapor-phase epitaxy (VPE), ultra-high vacuum CVD (UHV-CVD), LPCVD, and/or PECVD), molecular beam epitaxy, other suitable SEG processes, or combinations thereof.

Referring to FIGS. 1, 7A and 7B, at operation 108, an interlayer dielectric (ILD) layer 234 is formed over the substrate 202. In some embodiments, the ILD layer 234 includes a low-K (K<3.9) dielectric material, such as tetraethylorthosilicate (TEOS), un-doped silicate glass, or doped silicon oxide such as borophosphosilicate glass (BPSG), fluorosilicate glass (FSG), phosphosilicate glass (PSG), boron doped silicon glass (BSG), other suitable dielectric materials, or combinations thereof. The ILD layer 234 may be formed by a deposition process such as CVD, flowable CVD (FCVD), spin-on-glass (SOG), other suitable methods, or combinations thereof. In some embodiments, an etch stop layer (ESL, not shown) may be formed between the ILD layer 234 and the gate spacers 222, and between the ILD layer 234 and the S/D features 230. Subsequently, a planarization process (for example, a chemical mechanical planarization (CMP) process) may be performed to remove the top portion of the device 200 (for example, top portions of the ILD layer 234 and the dummy gate structure 220) to expose the dummy gate electrode.

Figures 8A, 8B:
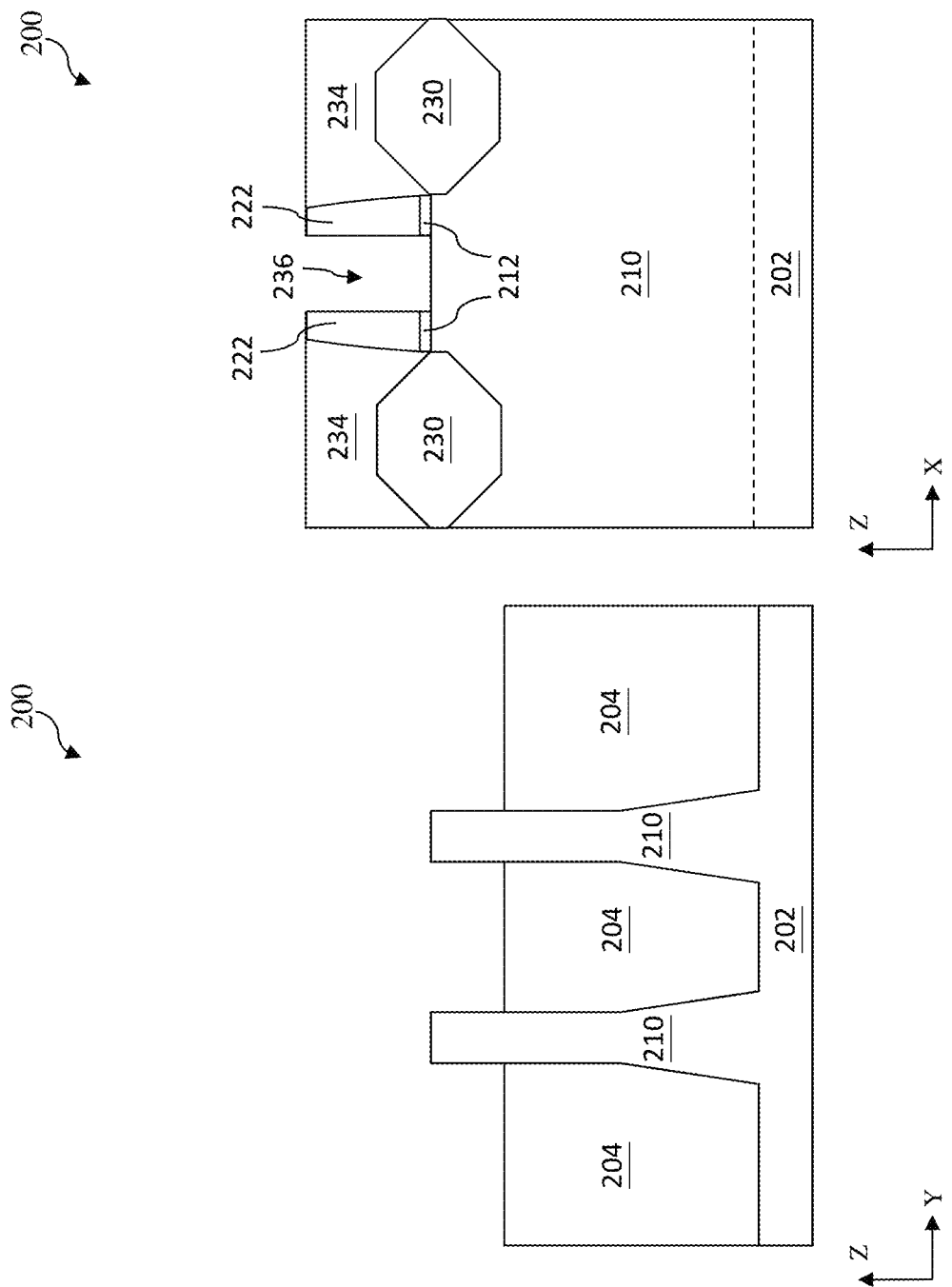

Referring to FIGS. 1, 8A and 8B, at operation 110, the remained portion of the dummy gate structure 220 is removed to form a gate trench 236 exposing the channel regions of the fins 210. In some embodiments, removing the dummy gate structure 220 comprises one or more etching processes, such as wet etching, dry etching, or a combination thereof. In some embodiments, a portion of the dummy dielectric layer 212 over the channel regions of the fins 210 is also removed at operation 110. Thereafter, a metal gate structure will be formed in the gate trench 236 in place of the dummy gate structure 220.

Referring to FIGS. 1, 9A and 9B, at operation 112, a gate interfacial layer 240 is formed in the gate trench 236. The gate interfacial layer 240 includes a dielectric material, such as SiO, SiON, hafnium silicate (HfSiO), other suitable dielectric material, or combinations thereof. The gate interfacial layer 240 may also be referred to as the interfacial layer 240. The gate interfacial layer 240 is formed by thermal oxidation, chemical oxidation, ALD, CVD, other suitable process, or combinations thereof. In the depicted embodiments, the interfacial layer 240 may be formed using a wet oxidation process and the interfacial layer 240 is selectively formed on exposed surfaces of the semiconductor fins 210. In alternative embodiment not explicitly shown, the interfacial layer 240 may be formed using CVD, ALD, or a suitable deposition technique and the interfacial layer 240 may also be deposited on the surfaces of the isolation structure 204.

Now referring to FIGS. 10, 11A and 11B, at operation 114, a gate dielectric layer 242 is formed over the gate interfacial layer 240 in the gate trench 236. In some embodiments, the gate dielectric layer 242 includes a high-K (K>3.9) dielectric material, such as $HfO_2$, HfSiO, $HfSiO_4$, HfSiON, HfLaO, HfTaO, HfSiO, HfZrO, HfAlOx, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-K (HK) dielectric material, or combinations thereof. Thus, the gate dielectric layer 242 is also referred to as a HK dielectric layer 242. The HK dielectric layer 242 may be deposited by ALD, CVD, PVD, oxidation-based deposition process, other suitable process, or combinations thereof. In some embodiments, the HK dielectric layer 242 has a thickness T1 of about 1 nm to about 2 nm.

Referring to FIGS. 10, 12A and 12B, at operation 116, a capping layer 244 is formed over the gate dielectric layer 242 in the gate trench 236. In some embodiments, the capping layer 244 includes a HK capping material such as titanium nitride (TiN), tantalum nitride (TaN), tennessine nitride (TsN), other suitable material, or a combination thereof. The capping layer 244 also includes silicon (Si) capping material over the HK capping material. The capping layer 244 is formed by an in-situ process, i.e. by multiple steps in one processing tool, such as a deposition tool. For example, the HK capping material is first deposited by ALD, or other deposition process, over the HK dielectric layer 242 in a deposition tool. Thereafter, in the same tool, a processing gas including silane ($SiH_4$) is passed through the top surface of the HK capping material to form a silicon capping over the HK capping material. In some embodiments, the silane gas is processed at a pressure of about 4 torr to about 6 torr, with a flow rate of about 300 sccm to about 500 sccm, for a time period of about 100 seconds to about 200 seconds. Thereby, the capping layer 244 including the HK capping and Si capping is formed within one processing tool.

In a conventional capping layer formation process, the HK capping material is deposited in a first processing tool (for example, an ALD tool), and the Si capping is formed in a second processing tool (for example, a CVD tool). During the movement of the device from the first processing tool to the second processing tool, the HK capping layer may be oxidized, which increase the difficulties and the cost of the later Si capping formation. In the present disclosure, the HK capping and Si capping formation are in the same processing tool, the HK capping oxidation can be mitigated or even avoided. Thus, the Si capping formation is more efficient and the total thickness of the capping layer (inducing the HK capping and the Si capping) is thinner compare with the one formed by the conventional method. In some embodiments, a thickness T2 of the capping layer is about 2 nm to about 3.5 nm, which is about 1.3 to about 2.3 times of the thickness T1 of the HK dielectric layer. The thickness T2 of the capping layer cannot be too thick or too thin, such that the capping layer can achieve the purpose to fine tune the Vt and the mobility of the device. A thickness T2 greater than 3.5 nm is not compatible with advanced process nodes that require small fin pitch and small gate pitch. When the thickness T2 is smaller than 2 nm, it is unlikely for the Si capping to attain uniform thickness as the Si capping is being deposited on the HK capping. In addition, since the capping layer formation is an in-situ process, the processing cost is reduced.

Referring to FIGS. 10, 13A and 13B, at operation 118, a post capping annealing (PCA) process is performed to the device 200. The annealing process can reduce the threshold voltage of the p-type field effect transistor (FET) and increase the mobility of the device. In some embodiments, the annealing process is a spike annealing process performed at a temperature of about 850° C. to about 950° C.

Figures 14A, 14B:
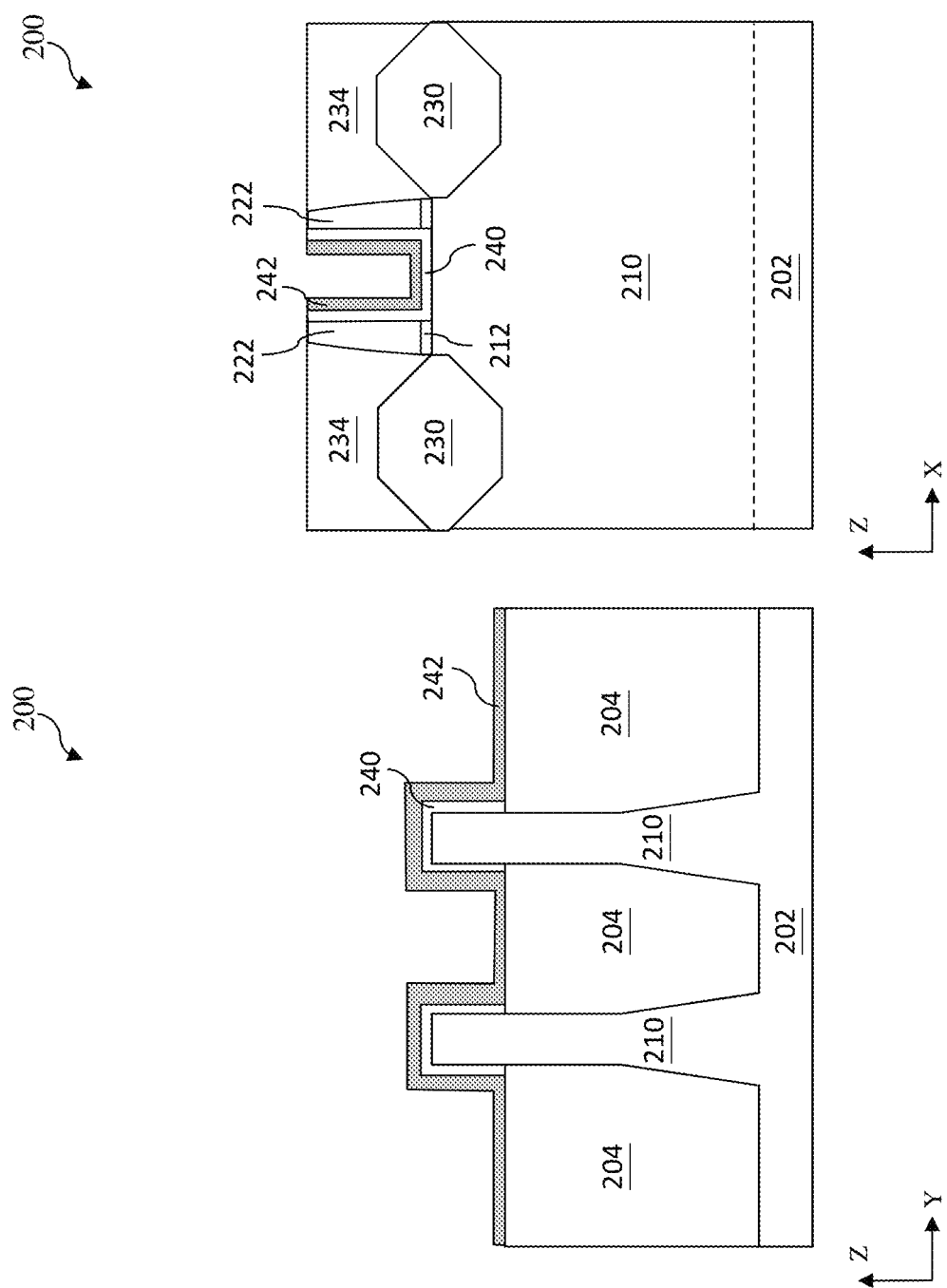

Referring to FIGS. 10, 14A and 14B, at operation 120, the capping layer 244 is removed, such that the HK dielectric layer 242 is exposed in the gate trench 236. In the present disclosure, the capping layer 244 is removed by wet only etching. No dry etching is involved in operation 120. In some embodiments, the wet etching is a selective etching including a wet etching step using dilute hydrogen fluoride (HF) for about 30 to 40 seconds and a wet etching step using ammonium hydroxide ($NH_4OH$), hydrogen peroxide ($H_2O_2$), or water ($H_2O$), for about 120 to 210 seconds.

In a conventional capping layer removal process, both dry etching and wet etching are needed. The energy of the radicals during the dry etching is pretty high which may damage the HK dielectric layer. However, in the present disclosure, since the oxidation of the HK capping material is mitigated or even avoided during the in-situ process, and the total thickness of the capping layer is thinner than the conventional one, only wet etching is needed to remove the capping layer. This wet only etching process protects the HK dielectric layer, such that the EOT of the HK dielectric layer can be increased, which can mitigate the gate leakage issue and boost the device performance. In addition, since only wet etching is used in capping layer removal, the processing cost is reduced.

Referring to FIGS. 10, 15A and 15B, at operation 122, a post deposition annealing (PDA) process is performed to the device 200. The annealing process can densify the HK dielectric layer 242 to obtain better maximum threshold voltage Vmax, such that the time-dependent dielectric breakdown (TDDB) of the device can be improved. In some embodiments, the annealing process is a spike annealing process performed at a temperature of about 850° C. to about 900° C.

Thereafter, referring to FIGS. 10, 16A and 16B, at operation 124, a gate electrode 246 is formed over the HK dielectric layer 242 to fill in the gate trench 236. In some embodiments, the gate electrode 246 includes one or more work function metal (WFM) layers and a bulk metal. The WFM layer is configured to tune a work function of its corresponding transistor to achieve a desired threshold voltage Vt. And, the bulk metal is configured to serve as the main conductive portion of the functional gate structure. In some embodiments, the material of the WFM layer may include TiAl, TiAlC, TaAlC, TiAlN, TiN, TSN, TaN, WCN, Mo, other materials, or combinations thereof. The WFM layer can be formed by any suitable method, such as CVD, ALD, PVD, plating, chemical oxidation, thermal oxidation, other suitable methods, or combinations thereof. Thereafter, the bulk metal, for example including Al, W, Cu, or combinations thereof, is formed in the gate trench 236 over the WFM layer. The bulk metal is formed by any suitable method, such as CVD, ALD, PVD, plating, chemical oxidation, thermal oxidation, other suitable methods, or combinations thereof. A planarization process (for example, CMP) is then performed to remove the excess bulk metal material.

Referring to FIGS. 10, 17A and 17B, at operation 126, further processing is performed to complete the fabrication of the device 200. For example, other multilayer interconnect features, such as S/D contacts 250, vias 260, metal lines (not shown), as well as ILD layers 264 and/or etch stop layers (not shown) are formed over the device 200, configured to connect the various features to form a functional circuit that comprises the different semiconductor devices.

FIGS. 18, 19A-26A and 19B-26B, combined with FIGS. 1, 2, 3A-9A and 3B-9B, disclose another example method of forming the example device 200 according to some other embodiments of the present disclosure. For the sake of simplicity, same reference numerals indicate same or similar features. The fabrication method to form the same or similar feature are the same unless it is specially indicated below. Further, the fabrication steps 102 to 112 are the same as those described in FIGS. 1, 2, 3A-9A and 3B-9B, and thus the details of those formation processes are not repeated herein.

Referring to FIGS. 18, 19A and 19B, at operation 114', an annealing process is performed to the device 200 after forming the gate interfacial layer 240. The annealing process is performed in nitrogen (N 2), hydrogen (H 2), or ammonia (NH 3) ambience to enhance the quality of the gate interfacial layer 240.

Figures 20A, 20B:
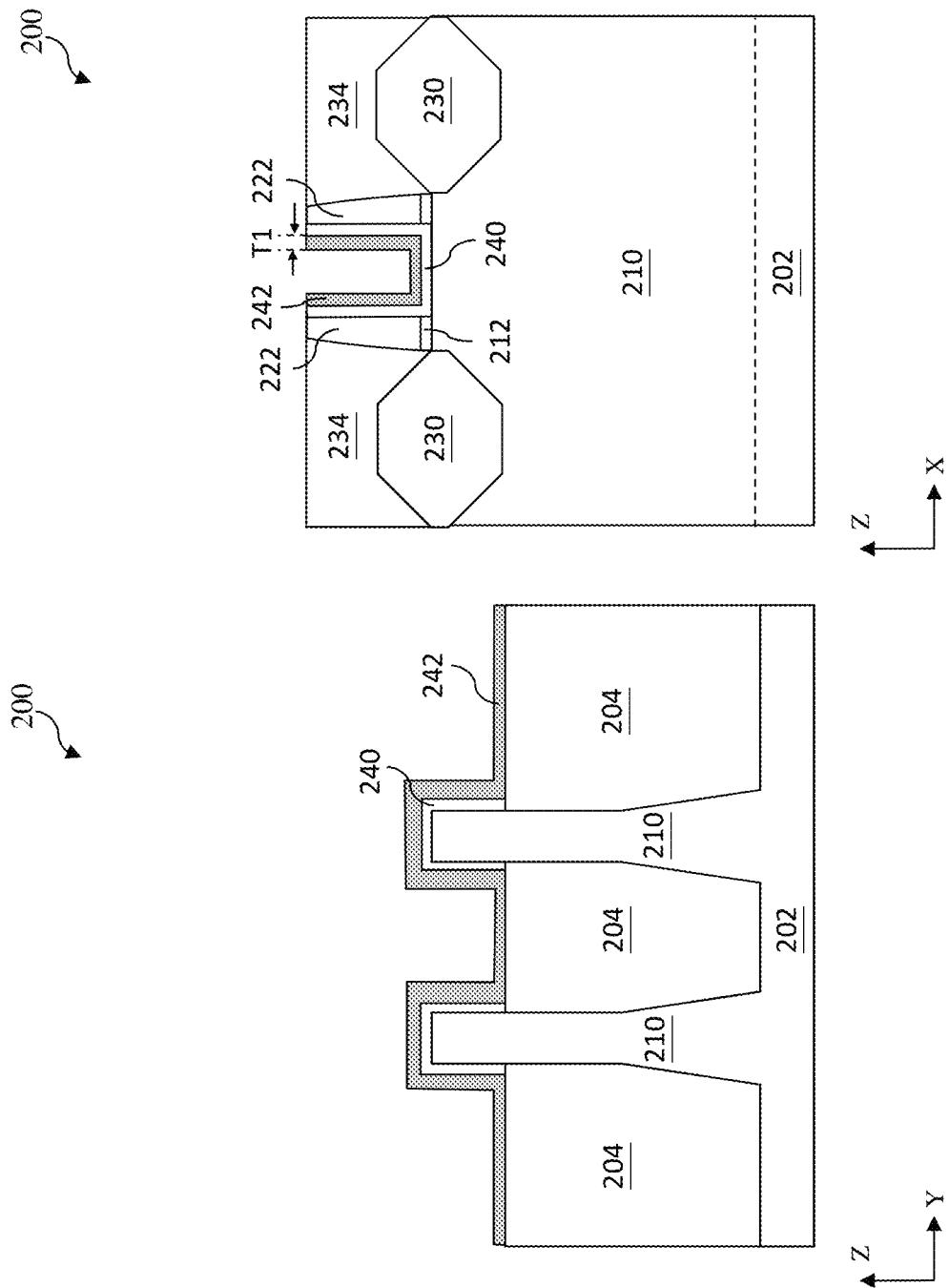

Referring to FIGS. 18, 20A and 20B, at operation 116', a gate dielectric layer 242 (also referred to as a HK dielectric layer 242) is formed over the gate interfacial layer 240 in the gate trench 236. In some embodiments, the HK dielectric layer 242 has a thickness T1 of about 1 nm to about 2 nm.

Referring to FIGS. 18, 21A and 21B, at operation 118', a post deposition annealing (PDA) process is performed to densify the HK dielectric layer 242, thereby to improve the TDDB of the device 200. In some embodiments, the annealing process is a spike annealing process performed at a temperature of about 850° C. to about 900° C.

Referring to FIGS. 18, 22A and 22B, at operation 120', a capping layer 244 is formed over the gate dielectric layer 242 in the gate trench 236. The capping layer 244 is formed by an in-situ process similar as operation 116 of FIG. 10. That is, the capping layer 244 (including HK capping and Si capping) is formed by multiple steps in one processing tool (for example, a deposition tool). For example, the HK capping material is first deposited by ALD, or other deposition process over the gate dielectric layer 242 in a deposition tool. Thereafter, in the same tool, a processing gas including silane ($SiH_4$) is passed through the top surface of the HK capping material to form a Si capping. In some embodiments, the silane gas is processed at a pressure of about 4 torr to about 6 torr, with a flow rate of about 300 sccm to about 500 sccm, for a time period of about 100 seconds to about 200 seconds. Due to the in-situ process, the HK capping oxidation can be mitigated or even avoided, and a total thickness of the capping layer (inducing the HK capping and the Si capping) is thinner than the one formed by the conventional method. The thickness T2 of the capping layer cannot be too thick or too thin, such that the capping layer can achieve the purpose to fine tune the Vt and the mobility of the device. In some embodiments, the thickness T2 of the capping layer is about 2 nm to about 3.5 nm, which is about 1.3 to about 2.3 times of the thickness T1 of the HK dielectric layer.

Figures 23A, 23B:
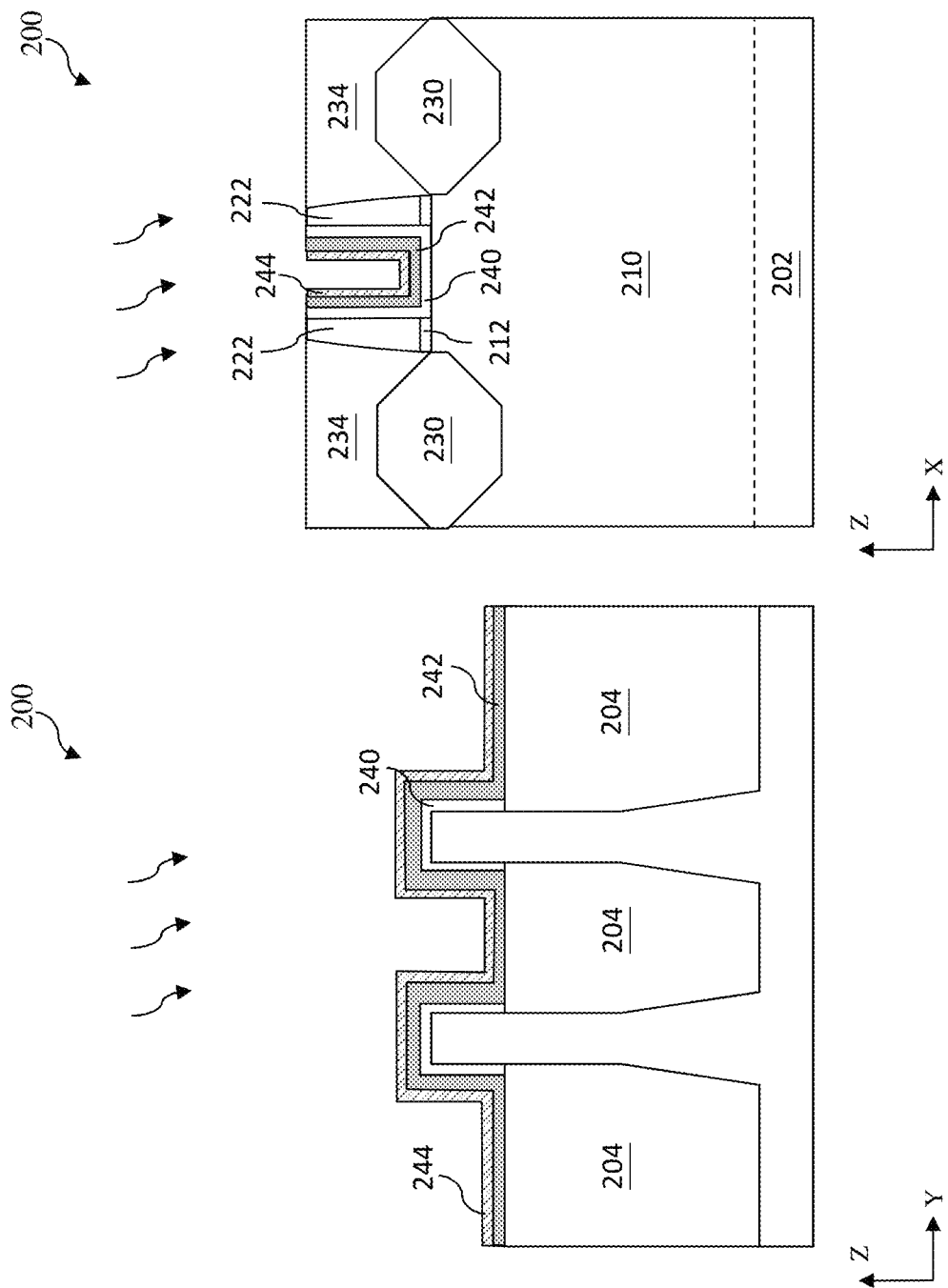
Figures 26A, 26B:
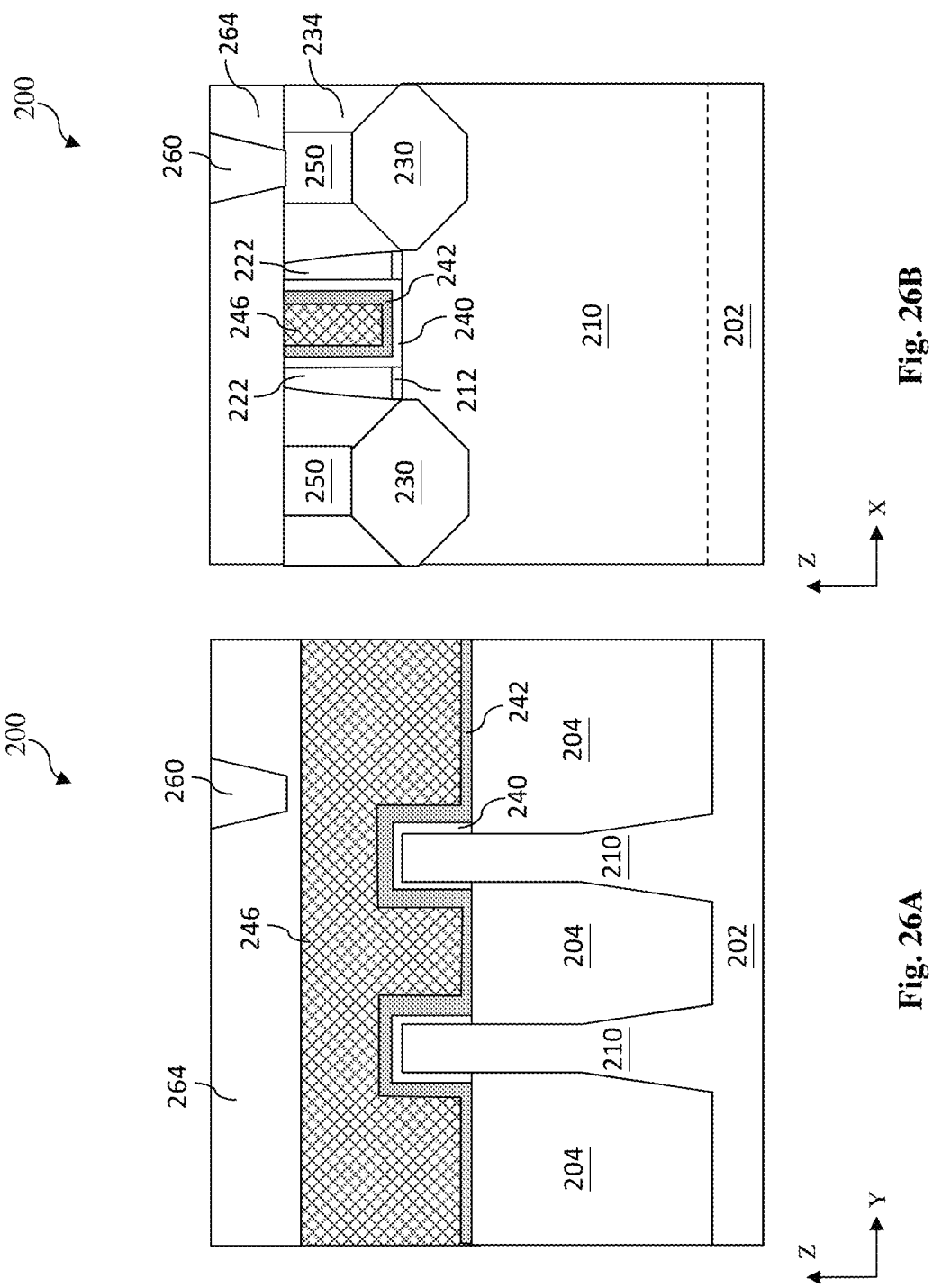

Referring to FIGS. 18, 23A and 23B, at operation 122', a post capping annealing (PCA) process is performed to the device 200. In some embodiments, the annealing process is a spike annealing process performed at a temperature of about 850° C. to about 950° C.

Referring to FIGS. 18, 24A and 24B, at operation 124', the capping layer 244 is removed by a wet only etching process, such that the HK dielectric layer 242 is exposed. No dry etching is involved in operation 124'. In some embodiments, the wet etching is a selective etching including a wet etching step using dilute hydrogen fluoride (HF) for about 30 to 40 seconds and a wet etching step using ammonium hydroxide ($NH_4OH$), hydrogen peroxide ($H_2O_2$), or water ($H_2O$), for about 120 to 210 seconds. This wet only etching process protects the HK dielectric layer, such that the EOT of the HK dielectric layer is increased, the gate leakage issue is mitigated, and the device performance is improved. In addition, the fabrication cost is reduced.

Thereafter, referring to FIGS. 18, 25A and 25B, at operation 126', a gate electrode 246 is formed over the HK dielectric layer 242 to fill in the gate trench 236. And, referring to FIGS. 18, 26A and 26B, at operation 128', further processing is performed to complete the fabrication of the device 200. For example, other multilayer interconnect features, such as S/D contacts 250, vias 260, metal lines (not shown), as well as ILD layers 264 and/or etch stop layer are formed over the device 200, configured to connect the various features to form a functional circuit that comprises the different semiconductor devices.

Although not intended to be limiting, one or more embodiments of the present disclosure provide many benefits to a semiconductor device and a formation process thereof. For example, embodiments of the present disclosure provide a post gate dielectric processing method of forming a semiconductor device, wherein the capping layer is formed by an in-situ process, i.e. the HK capping and Si capping are formed in the same processing tool. Therefore, the oxidation to the HK capping is mitigated or even avoided, and the thickness of the capping layer is reduced. The later process to remove the capping layer includes wet only etching process. The elimination of the dry etching during the capping layer removal process can protect the HK gate dielectric layer from being damaged. Thereby, the EOT scaling of the HK gate dielectric layer can be increased, the gate leakage issue can be mitigated, the device TDDB can be improved. In addition, the in-situ formation of the capping layer and the wet only etching process thereafter can reduce the fabrication cost.

The present disclosure provides for many different embodiments. An exemplary method of forming a semiconductor device comprises forming a semiconductor fin over a substrate, forming spacers over the semiconductor fin, wherein the spacers form a trench over the semiconductor fin, depositing a high-K dielectric layer in the trench, forming a capping layer over the high-K dielectric layer in one processing tool, performing an annealing process to the capping layer, removing the capping layer to expose the high-K dielectric layer, and forming a metal gate electrode over the high-K dielectric layer.

In some embodiments, the forming of the capping layer over the high-K dielectric layer includes depositing high-K capping material over the high-K dielectric layer in the processing tool, and passing a processing gas, in the processing tool, over a top surface of the high-K capping material to form the capping layer. In some implementations, the high-K capping material includes titanium nitride (TiN), tantalum nitride (TaN), or tennessine nitride (TsN). In some instances, the processing gas is silane ($SiH_4$) and is passed at a pressure of about 4 to 6 torr, with a flow rate of about 300 to 500 sccm, and for a period of about 100 to 200 seconds. In some embodiments, a thickness ratio of the capping layer to the high-K dielectric layer is about 1.3 to about 2.3. In some embodiments, removing the capping layer includes a wet only etching process. In some implementations, performing an annealing process to the capping layer includes performing a spike annealing process to the capping layer for a temperature of about 850° C. to about 950° C. In some instances, the method may further include performing an annealing process to the high-K dielectric layer after removing the capping layer.

Another exemplary method of forming a semiconductor device includes forming a semiconductor fin over a substrate, forming spacers over the semiconductor fin, wherein the spacers forms a trench over the semiconductor fin, forming an interfacial layer in the trench, depositing a high-K dielectric layer over the interfacial layer, performing an annealing process to the high-K dielectric layer, forming a capping layer over the high-K dielectric layer in one processing tool, performing an annealing process to the capping layer, removing the capping layer to expose the high-K dielectric layer, and forming a metal gate electrode over the high-K dielectric layer.

In some embodiments, the method may further include performing an annealing process to the interfacial layer before depositing the high-K dielectric layer. In some implementations, the annealing process to the interfacial layer is applied in an ambiance including at least one of nitrogen, hydrogen, and ammonia. In some instances, forming spacers over the semiconductor fin includes forming a dummy gate structure over the semiconductor fin, forming spacers along sidewalls of the dummy gate structure, and removing the dummy gate structure to form the trench over the semiconductor fin. In some embodiments, forming the capping layer over the high-K dielectric layer includes depositing high-K capping material over the high-K dielectric layer in the processing tool, and passing a processing gas, in the processing tool, to a top of the high-K capping material to form the capping layer. In some instances, the capping layer has a thickness of about 2 nm to about 3.5 nm. In some embodiments, removing the capping layer includes a selective wet only etching process, wherein the selective wet only process includes an etching step using a first etchant for about 30 to 40 seconds and an etching step using a second etchant for about 120 to 210 seconds. In some instances, the first etchant is diluted hydrogen fluoride (HF), the second etchant is ammonium hydroxide ($NH_4OH$), hydrogen peroxide ($H_2O_2$), or water ($H_2O$).

Another exemplary method of forming a semiconductor device comprises forming a semiconductor fin over a substrate, forming spacers over the semiconductor fin, wherein the spacers forms a trench over the semiconductor fin, depositing a high-K dielectric layer in the trench, depositing a high-K capping material over the high-K dielectric layer, passing a processing gas over a top surface of the high-K capping material to form a capping layer, performing an annealing process to the capping layer, removing the capping layer to expose the high-K dielectric layer, and forming a metal gate electrode over the high-K dielectric layer.

In some embodiments, the high-K capping material is deposited by an atomic layer deposition (ALD) process. In some implementations, the method may further include performing an annealing process to the high-K dielectric layer. In some instances, the steps of depositing the high-K capping material over the high-K dielectric layer and passing the processing gas over a top surface of the high-K capping material are performed in a same tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming an active region over a substrate;
    forming a dummy gate structure over a channel region of the active region;
    forming a first gate spacer and a second gate spacer along sidewalls of the dummy gate structure;
    removing the dummy gate structure to form a gate trench defined between the first gate spacer and the second gate spacer;
    after the removing of the dummy gate structure, forming an interfacial layer over the gate trench;
    depositing a high-K dielectric layer in the gate trench and over the interfacial layer;
    forming a capping layer over the high-K dielectric layer;
    after the forming of the capping layer, performing a first annealing process to the capping layer;
    after the first annealing process, completely removing the capping layer to expose the high-K dielectric layer; and
    forming a metal gate electrode over the high-K dielectric layer.

2. The method of claim 1, wherein the depositing of the capping layer comprises:
    depositing a high-k capping layer in the gate trench; and
    depositing a silicon capping layer over the high-k capping layer.

3. The method of claim 2, wherein the depositing of the high-k capping layer and depositing of the silicon capping layer are performed in a single processing tool such that the high-k capping layer is not oxidized.

4. The method of claim 2, wherein the high-k capping layer comprises a metal nitride.

5. The method of claim 2, wherein the high-k capping layer comprises titanium nitride (TiN), tantalum nitride (TaN), or tennessine nitride (TsN).

6. The method of claim 2, wherein the depositing of the silicon capping layer comprises use of silane ($SiH_4$).

7. The method of claim 1, wherein the first annealing process comprises a spike anneal process and an annealing temperature between about 850° C. and about 950° C.

8. The method of claim 1, further comprising:
    after the removing of the capping layer, performing a second annealing process to densify the high-k dielectric layer.

9. The method of claim 8, wherein the second annealing process comprises a spike annealing process and an annealing temperature between about 850° C. and about 900° C.

10. The method of claim 1, wherein the removing of the capping layer comprises a wet only process.

11. The method of claim 10, wherein the wet only process comprises:
    a first etching step that includes use of dilute hydrogen fluoride; and
    a second etching step that includes use of ammonium hydroxide ($NH_4OH$), hydrogen peroxide ($H_2O_2$), or water ($H_2O$).

12. A method of forming a semiconductor device, comprising:
- forming an active region over a substrate;
- forming a dummy gate structure over a channel region of the active region;
- forming a first gate spacer and a second gate spacer along sidewalls of the dummy gate structure;
- removing the dummy gate structure to form a gate trench defined between the first gate spacer and the second gate spacer;
- forming an interfacial layer over the active region;
- depositing a high-K dielectric layer in the gate trench and over the interfacial layer;
- forming a capping layer over the high-K dielectric layer, the capping layer comprising a high-k capping layer and a silicon capping layer,
- after the forming of the capping layer, performing a first annealing process to the capping layer;
- after the first annealing process, completely removing the capping layer to expose the high-K dielectric layer;
- after the completely removing, performing a second annealing process to densify the high-k dielectric layer; and
- forming a metal gate electrode over the high-K dielectric layer.

13. The method of claim 12, wherein the first annealing process comprises a spike anneal process and an annealing temperature between about 850° C. and about 950° C.

14. The method of claim 12, wherein the second annealing process comprises a spike annealing process and an annealing temperature between about 850° C. and about 900° C.

15. The method of claim 12, wherein the removing of the capping layer comprises a wet only process.

16. The method of claim 15, wherein the wet only process comprises:
- a first etching step that includes use of dilute hydrogen fluoride; and
- a second etching step that includes use of ammonium hydroxide ($NH_4OH$), hydrogen peroxide ($H_2O_2$), or water ($H_2O$), wherein the second etching step lasts longer than the first etching step.

17. A method of forming a semiconductor device, comprising:
- forming an active region over a substrate;
- forming a dummy gate structure over a channel region of the active region;
- forming a first gate spacer and a second gate spacer along sidewalls of the dummy gate structure;
- removing the dummy gate structure to form a gate trench defined between the first gate spacer and the second gate spacer;
- forming an interfacial layer over the active region;
- after the forming of the interfacial layer, performing a first annealing process to enhance a quality of the interfacial layer;
- depositing a high-K dielectric layer in the gate trench and over the interfacial layer;
- after the depositing of the high-k dielectric layer, performing a second annealing process to densify the high-k dielectric layer;
- forming a capping layer over the high-K dielectric layer, the capping layer comprising a high-k capping layer and a silicon capping layer,
- after the forming of the capping layer, performing a third annealing process;
- after the third annealing process, completely removing the capping layer to expose the high-K dielectric layer; and
- forming a metal gate electrode over the high-K dielectric layer.

18. The method of claim 17, wherein the first annealing process is performed in an ambience comprising nitrogen ($N_2$), hydrogen ($H_2$), or ammonia ($NH_3$).

19. The method of claim 17, wherein the second annealing process comprises a spike annealing process and an annealing temperature between about 850° C. and about 900° C.

20. The method of claim 17, wherein the third annealing process comprises a spike anneal process and an annealing temperature between about 850° C. and about 950° C.

* * * * *